(12) United States Patent
So et al.

(10) Patent No.: US 10,700,024 B2
(45) Date of Patent: Jun. 30, 2020

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Won Wook So, Suwon-Si (KR); Yong Ho Baek, Suwon-Si (KR); Doo Il Kim, Suwon-Si (KR); Young Sik Hur, Suwon-Si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/958,573

(22) Filed: Apr. 20, 2018

(65) Prior Publication Data

US 2019/0057944 A1    Feb. 21, 2019

(30) Foreign Application Priority Data

Aug. 18, 2017  (KR) .................. 10-2017-0104603
Nov. 30, 2017  (KR) .................. 10-2017-0163040

(51) Int. Cl.
*H01L 23/66*  (2006.01)
*H01L 25/10*  (2006.01)
(Continued)

(52) U.S. Cl.
CPC ............ *H01L 23/66* (2013.01); *H01L 21/568* (2013.01); *H01L 23/3128* (2013.01);
(Continued)

(58) Field of Classification Search
CPC ... H01L 23/544; H01L 21/561; H01L 23/562; H01L 24/19; H01L 24/20; H01L 24/96;
(Continued)

(56) References Cited

U.S. PATENT DOCUMENTS 5,858,816 A * 1/1999 Sato .................... H01L 21/4803
                                                  438/125
7,518,553 B2    4/2009 Zhang et al.
(Continued)

FOREIGN PATENT DOCUMENTS

CN        103779319 A     5/2014
JP        2002-111226 A   4/2002
(Continued)

OTHER PUBLICATIONS

Taiwanese Office Action dated Dec. 12, 2018 issued in Taiwanese Patent Application No. 107113338 (with English translation).
(Continued)

*Primary Examiner* — Brian Turner
(74) *Attorney, Agent, or Firm* — Morgan, Lewis Bockius LLP

(57) ABSTRACT

A fan-out semiconductor package includes: a core member having a through-hole; a semiconductor chip disposed in the through-hole; an encapsulant encapsulating at least portions of the core member and the semiconductor chip; and a connection member disposed on the core member and an active surface of the semiconductor chip and including a redistribution layer connected to the connection pads. The core member includes a plurality of wiring layers disposed on different levels, a dielectric is disposed between the plurality of wiring layers of the core member, one of the plurality of wiring layers includes an antenna pattern, the other of the plurality of wiring layers includes a ground pattern, and the antenna pattern is connected to the connection pads through the redistribution layer in a signal manner.

2 Claims, 26 Drawing Sheets

(51) Int. Cl.
| | |
|---|---|
| *H01Q 1/22* | (2006.01) |
| *H01Q 1/48* | (2006.01) |
| *H01L 23/31* | (2006.01) |
| *H01L 23/00* | (2006.01) |
| *H01Q 9/04* | (2006.01) |
| *H01L 21/56* | (2006.01) |
| *H01Q 21/06* | (2006.01) |
| *H01Q 1/24* | (2006.01) |
| *H01Q 1/40* | (2006.01) |

(52) U.S. Cl.
CPC .............. *H01L 24/09* (2013.01); *H01L 24/14* (2013.01); *H01L 24/17* (2013.01); *H01L 24/19* (2013.01); *H01L 24/20* (2013.01); *H01Q 1/2283* (2013.01); *H01Q 9/0407* (2013.01); *H01Q 21/065* (2013.01); *H01L 2223/6677* (2013.01); *H01L 2224/02379* (2013.01); *H01L 2224/0401* (2013.01); *H01L 2224/13101* (2013.01); *H01L 2224/73204* (2013.01); *H01L 2924/1431* (2013.01); *H01L 2924/1433* (2013.01); *H01L 2924/1434* (2013.01); *H01L 2924/15311* (2013.01); *H01L 2924/15313* (2013.01); *H01L 2924/181* (2013.01); *H01L 2924/18162* (2013.01); *H01L 2924/3511* (2013.01); *H01Q 1/243* (2013.01); *H01Q 1/40* (2013.01)

(58) Field of Classification Search
CPC .......... H01L 24/97; H01L 2924/35121; H01L 21/568; H01L 2224/04105; H01L 2224/12105; H01L 2224/2919; H01L 2224/32225; H01L 2224/73267; H01L 2224/9222; H01L 2225/1035; H01L 2225/1041; H01L 2924/1431; H01L 2924/1432; H01L 2924/1436; H01L 2924/3511; H01L 2924/3512; H01L 2224/29016; H01L 2924/37001

See application file for complete search history.

(56) References Cited

U.S. PATENT DOCUMENTS

| | | | |
|---|---|---|---|
| 2003/0148739 | A1* | 8/2003 | Kosemura ........... H01F 17/0006 455/73 |
| 2005/0211465 | A1* | 9/2005 | Sunohara ............ H01L 23/5389 174/260 |
| 2010/0193935 | A1 | 8/2010 | Lachner et al. |
| 2013/0241059 | A1* | 9/2013 | Boeck ............... H01L 23/49816 257/738 |
| 2014/0103527 | A1 | 4/2014 | Marimuthu et al. |
| 2014/0110840 | A1 | 4/2014 | Wojnowski et al. |
| 2014/0252573 | A1* | 9/2014 | Lin ......................... H01L 24/19 257/666 |
| 2014/0291859 | A1* | 10/2014 | Kiwanami ............ H01L 23/485 257/774 |
| 2015/0016078 | A1 | 1/2015 | Yang et al. |
| 2016/0043047 | A1 | 2/2016 | Shim et al. |
| 2016/0306034 | A1 | 10/2016 | Trotta et al. |
| 2017/0033062 | A1 | 2/2017 | Liu et al. |
| 2017/0040266 | A1* | 2/2017 | Lin ..................... H01L 23/5383 |
| 2019/0101636 | A1* | 4/2019 | Trotta ..................... G01S 13/66 |

FOREIGN PATENT DOCUMENTS

| | | |
|---|---|---|
| JP | 2013-105992 A | 5/2013 |
| TW | 201618196 A | 5/2016 |

OTHER PUBLICATIONS

Office Action issued in corresponding Korean Application No. 10-2017-0163040, dated Feb. 18, 2019.

\* cited by examiner

FAN-OUT SEMICONDUCTOR PACKAGE

CROSS-REFERENCE TO RELATED APPLICATION(S)

This application claims benefit of priority to Korean Patent Application Nos. 10-2017-0104603 filed on Aug. 18, 2017 and 10-2017-0163040 filed on Nov. 30, 2017 in the Korean Intellectual Property Office, the disclosure of which is incorporated herein by reference in its entirety.

TECHNICAL FIELD

The present disclosure relates to a fan-out semiconductor package in which an antenna pattern and a ground pattern are formed.

BACKGROUND

Applications that use a millimeter wave of 10 GHz or more have been widely used for motion sensor products that detect motion to increase user interface (I/F) convenience, action monitoring sensor products for security that confirm an intruder in a predetermined space, 24 GHz and 77 GHz radar systems for near-field and far-field detection for an automobile, and the like, as well as fifth generation (5G) communications for mobile or 60 GHz communications. In a case of the product that uses the millimeter wave as described above, when a signal is transferred from a radio frequency integrated circuit (RFIC) to an antenna or from the antenna to the RFIC, the signal should be transferred so that as little signal loss is generated as possible. Conventionally, to this end, the RFIC and the antenna are connected to each other through a coaxial cable to minimize signal attenuation, which is inefficient in terms of space and a cost.

Recently, in a 60 GHz communications system, a manner of designing a 60 GHz antenna using a material such as a low temperature co-fired ceramic (LTCC), or the like, and then attaching the 60 GHz antenna to the RFIC to significantly reduce a distance between components has started to be used. In addition, in a radar system for an automobile, a manner of mounting the RFIC on a main printed circuit board (PCB) and forming and connecting the antenna as patterns on and to the main PCB or mounting a separate antenna module to the main PCB has been used. However, also in this manner, it is difficult to sufficiently prevent generation of line-to-line loss between components.

Recently, in accordance with the development of package technology, a method of forming an antenna in an RFIC package has been developed, and a manner of forming antenna patterns on redistribution layers (RDL) of the RFIC package has been used in some cases. However, also in this manner, there are several design limitations in securing radiation performance of the antenna or there is the possibility that an error of performance will occur. Therefore, stable RFIC and antenna integration package design technology capable of having a flexible degree of freedom in a design and significantly reducing a design error has been required.

SUMMARY

An aspect of the present disclosure may provide a fan-out semiconductor package in which loss of a signal transfer may be prevented by significantly reducing a distance between a semiconductor chip and an antenna pattern, stable antenna performance may be secured in a single package, an overall size of a package may be reduced, and a process may be simplified.

According to an aspect of the present disclosure, a fan-out semiconductor package may be provided, in which a single core member having a through-hole is introduced into a region in which a semiconductor chip is encapsulated, the semiconductor chip is disposed in the through-hole of the core member, and an antenna pattern and a ground pattern are formed on different levels of the core member including a dielectric.

According to an aspect of the present disclosure, a fan-out semiconductor package may include: a core member having a through-hole; a semiconductor chip disposed in the through-hole and having an active surface having connection pads disposed thereon and an inactive surface opposing the active surface; an encapsulant encapsulating at least portions of the core member and the semiconductor chip; and a connection member disposed on the core member and the active surface of the semiconductor chip and including a redistribution layer connected to the connection pads. The core member may include a plurality of wiring layers disposed on different levels, a dielectric may be disposed between the plurality of wiring layers of the core member, one of the plurality of wiring layers may include an antenna pattern, another of the plurality of wiring layers may include a ground pattern, and the antenna pattern may be connected to the connection pads through the redistribution layer in a signal manner.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
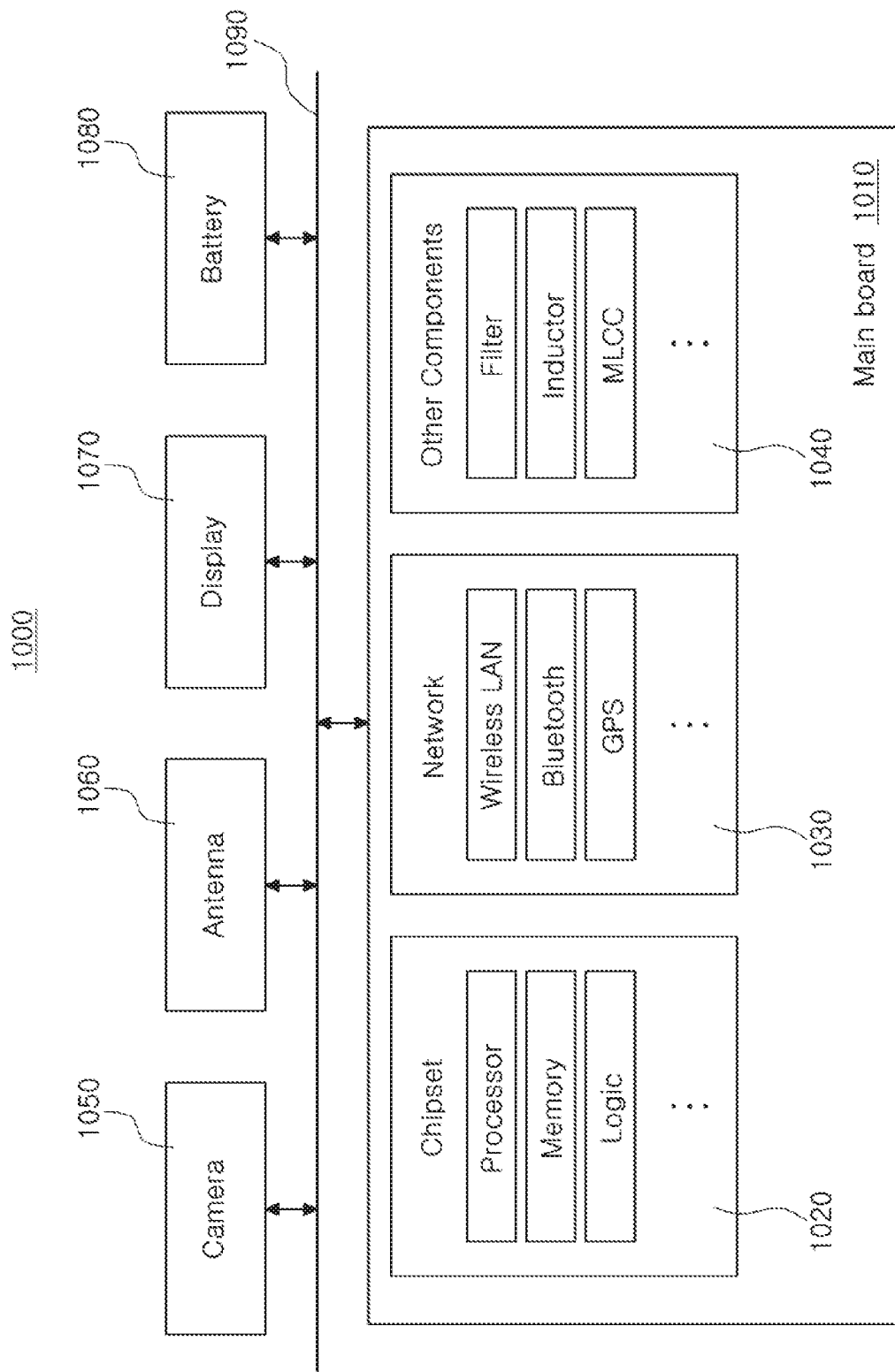
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or stylized for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip-related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, and may be any other electronic device processing data.

Figure 2:
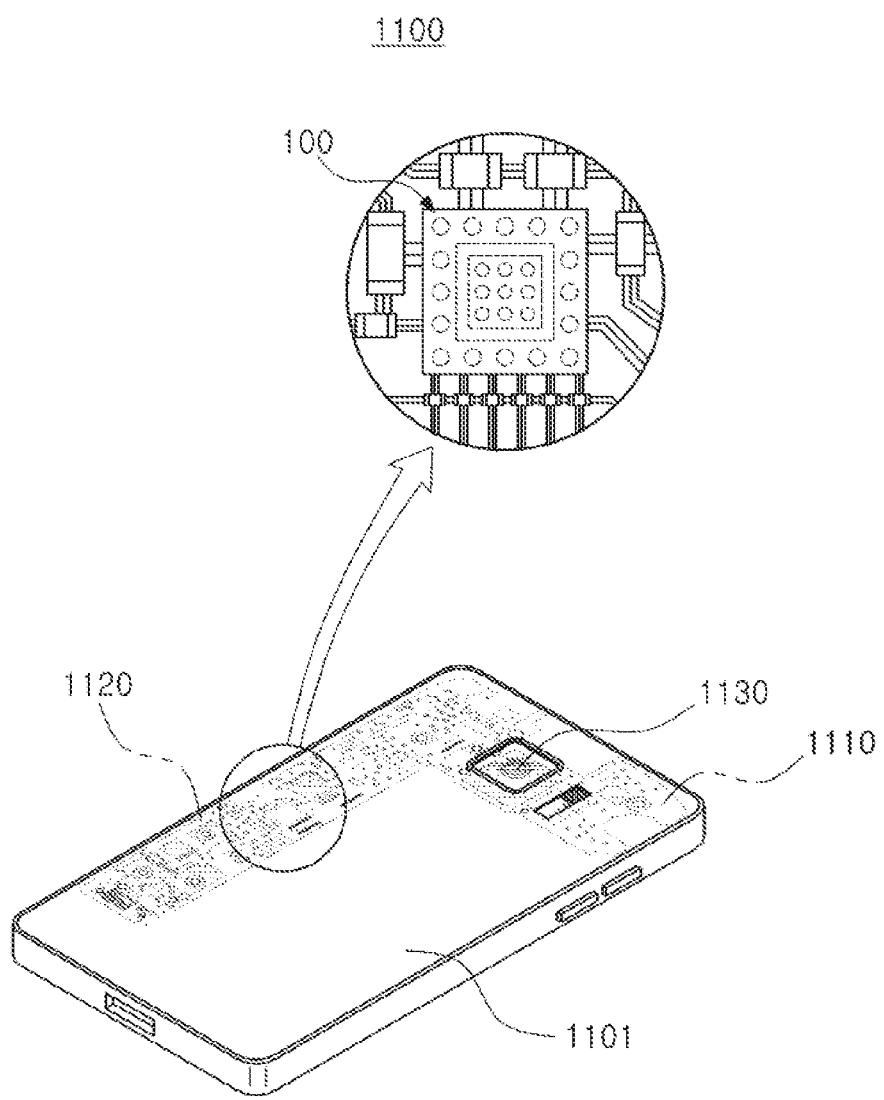
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various components 1120 may be physically or electrically connected to the motherboard 1110. In addition, other components that may or may not be physically or electrically connected to the mainboard 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required, due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
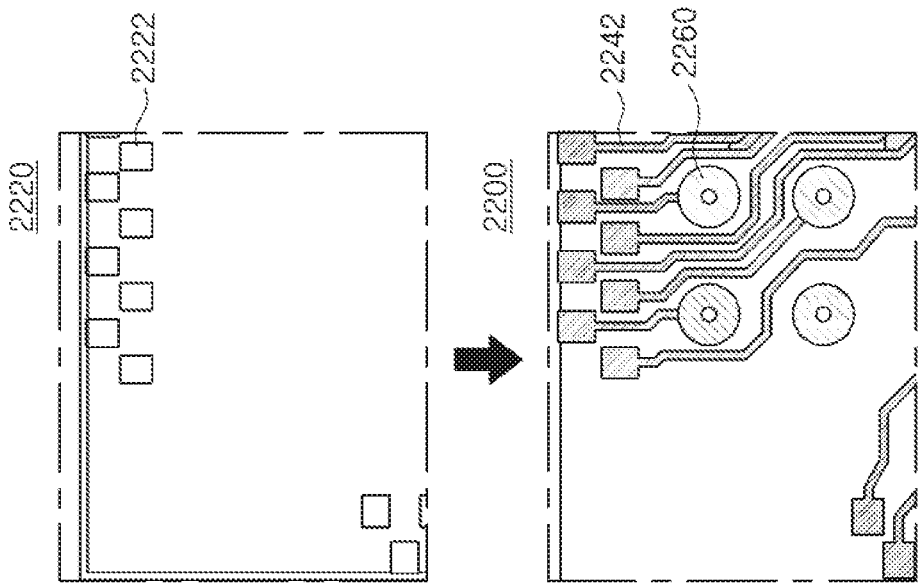
FIGS. 3A and 3B are schematic cross-sectional views illustrating states of a fan-in semiconductor package before and after being packaged.
Figure 3A:
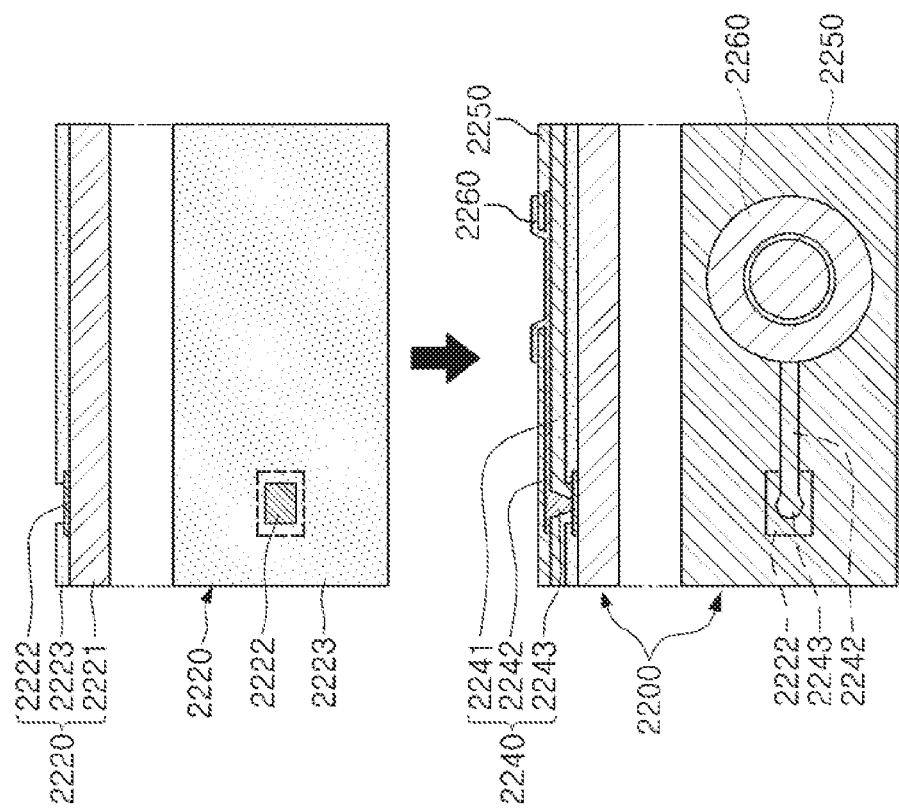

FIGS. 3A and 3B are schematic cross-sectional views illustrating states of a fan-in semiconductor package before and after being packaged.

Figure 4:
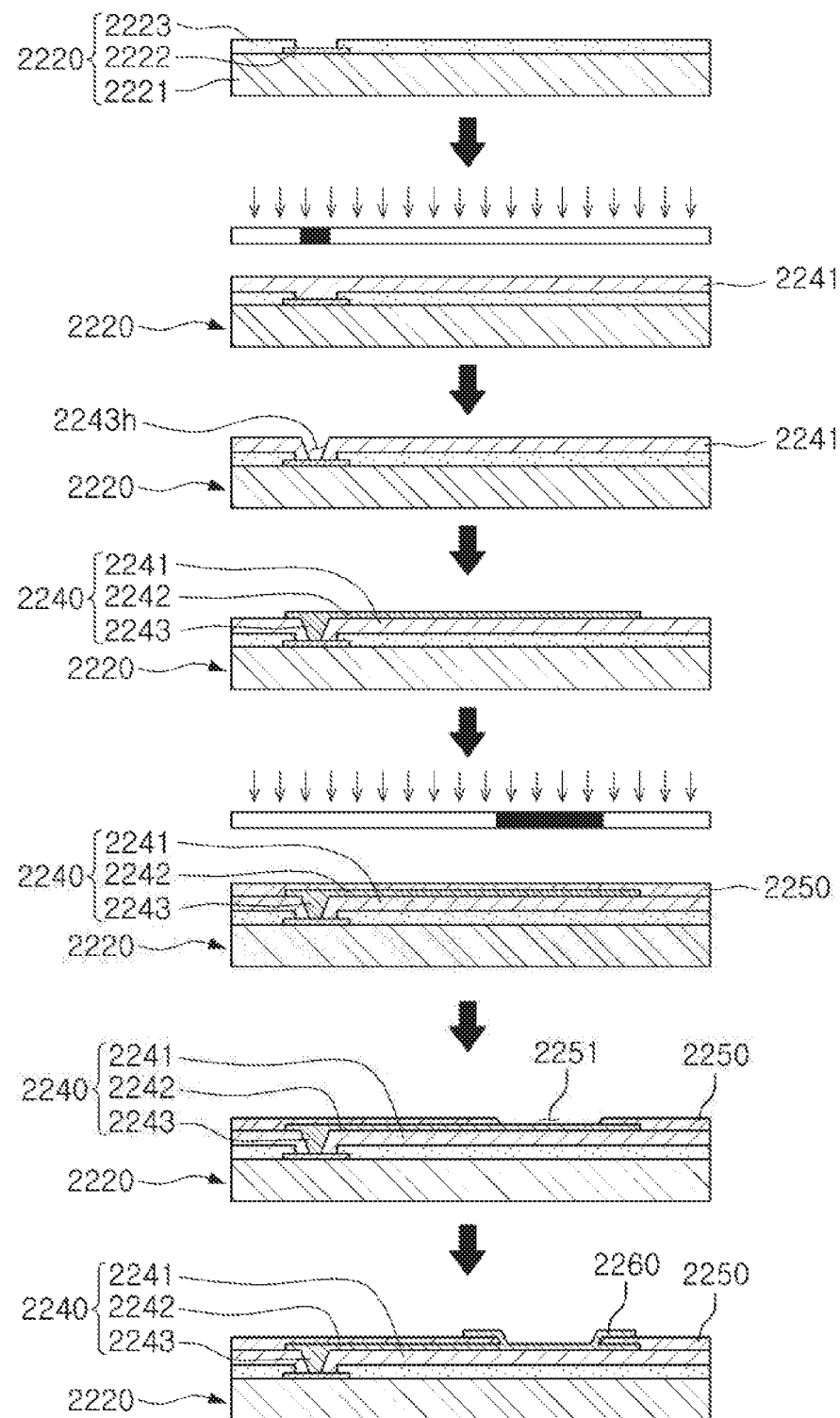
FIG. 4 is schematic cross-sectional views illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
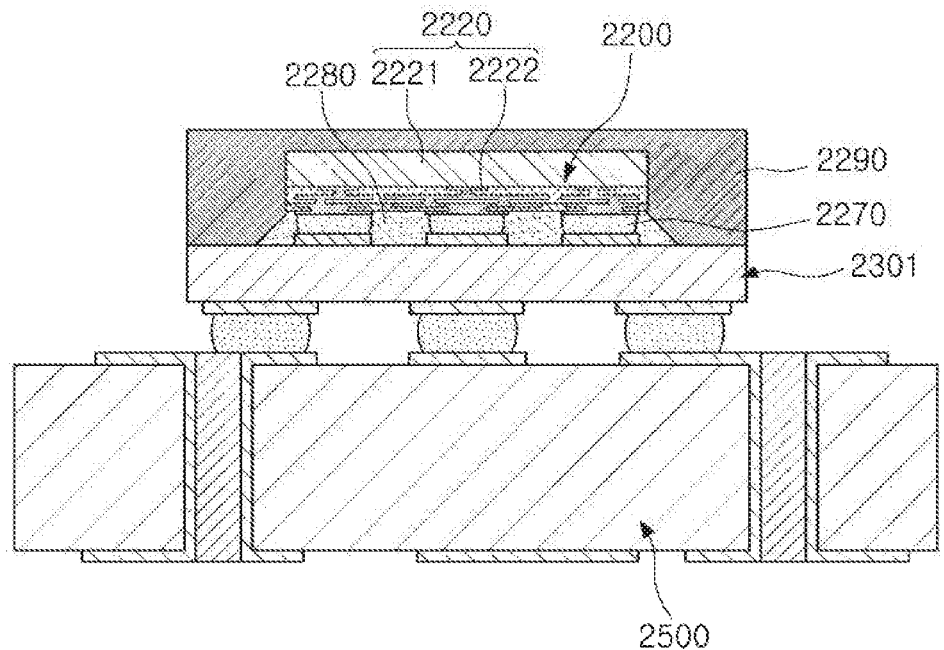
FIG. 5 is a schematic cross-sectional view illustrating a case in which a fan-in semiconductor package is mounted on a ball grid array (BGA) substrate and is finally mounted on a main board of an electronic device.

FIG. 5 is a schematic cross-sectional view illustrating a case in which a fan-in semiconductor package is mounted on an interposer substrate and is ultimately mounted on a mainboard of an electronic device.

Figure 6:
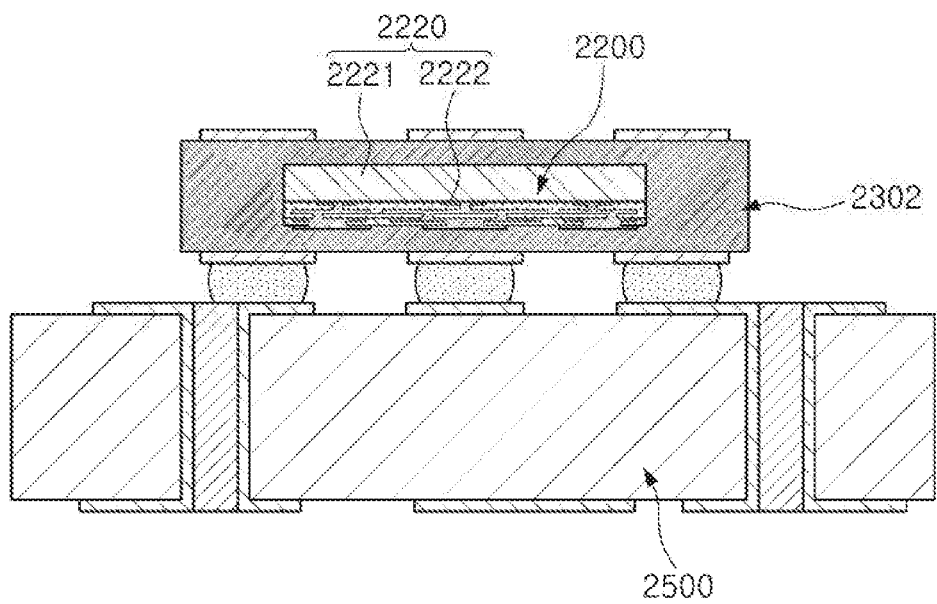
FIG. 6 is a schematic cross-sectional view illustrating a case in which a fan-in semiconductor package is embedded in a BGA substrate and is finally mounted on a main board of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
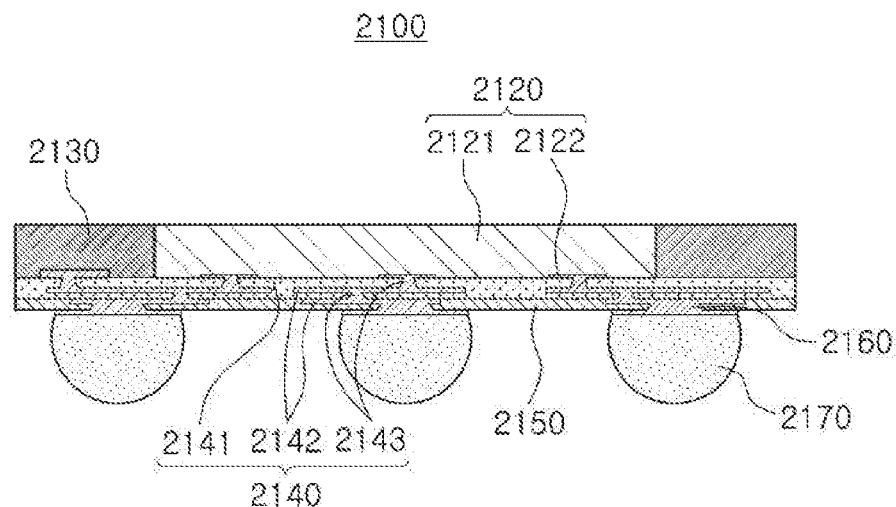
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may further be formed on the connection member 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
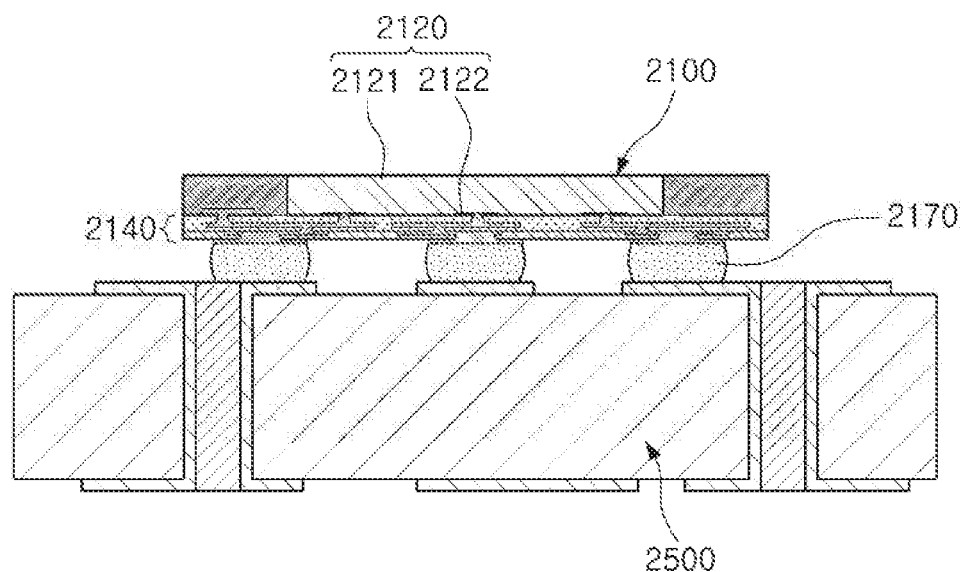
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a core member having an antenna pattern and a ground pattern formed therein is introduced will hereinafter be described with reference to the drawings.

Fan-Out Semiconductor Package

Figure 9:
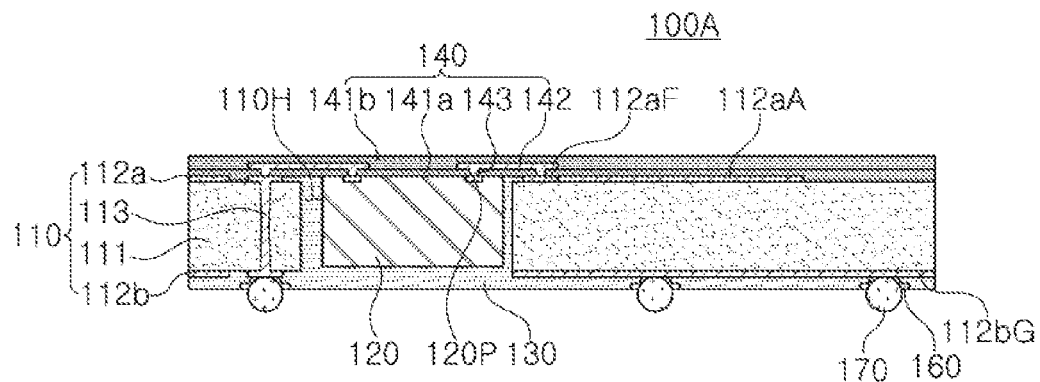
FIG. 9 is a schematic cross-sectional view illustrating an example of a fan-out semiconductor package.

FIG. 9 is a schematic cross-sectional view illustrating an example of a fan-out semiconductor package.

Figure 10:
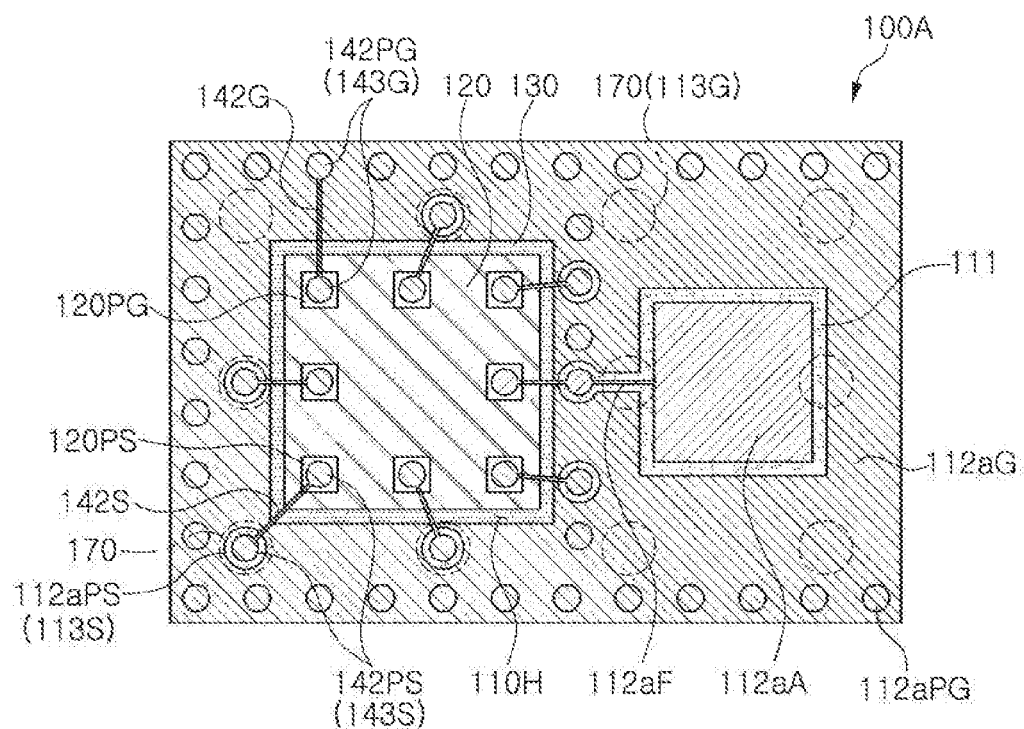
FIG. 10 is a schematic plan view illustrating the fan-out semiconductor package of FIG. 9 when viewed from above.

FIG. 10 is a schematic plan view illustrating the fan-out semiconductor package of FIG. 9 when viewed from above.

Figure 11:
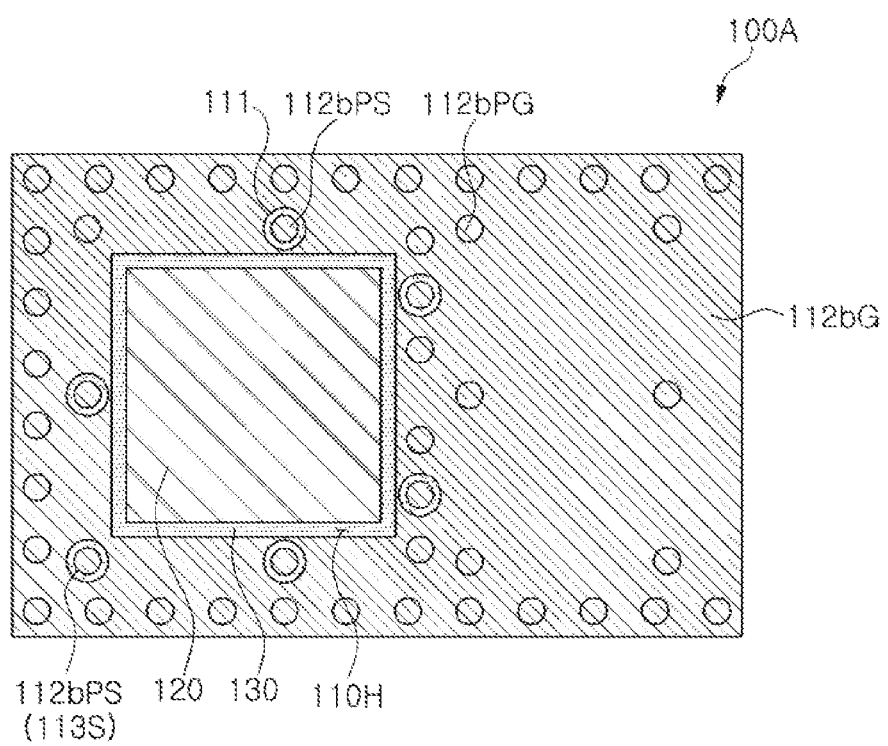
FIG. 11 is a schematic plan view illustrating the fan-out semiconductor package of FIG. 9 when viewed from below.

FIG. 11 is a schematic plan view illustrating the fan-out semiconductor package of FIG. 9 when viewed from below.

Referring to FIGS. 9 through 11, a fan-out semiconductor package 100A according to an exemplary embodiment in the present disclosure may include a core member 110 having a through-hole 110H, a semiconductor chip 120 disposed in the through-hole 110H and having an active surface having connection pads 120P disposed thereon and an inactive surface opposing the active surface, an encapsulant 130 encapsulating at least portions of the core member 110 and the semiconductor chip 120, and a connection member 140 disposed on the core member 110 and the active surface of the semiconductor chip 120. The semiconductor chip 120 may be disposed in face-up form so that the active surface is directed toward the top in the drawings. The core member 110 may include an insulating layer 111, wiring layers 112a and 112b formed on opposite surfaces of the insulating layer 111, and vias 113 connecting the wiring layers 112a and 112b to each other. A first wiring layer 112a of the core member 110 may include an antenna pattern 112aA, and a second wiring layer 112b of the core member 110 may include a ground pattern 112bG. The first wiring layer 112a may include the antenna pattern 112aA. The antenna pattern 112aA may be connected to a redistribution layer 142 through a feeding line 112aF in a signal manner to be thus connected to the connection pads 120P of the semiconductor chip 120 in a signal manner. An underbump metal layer 160 and electrical connection structures 170 may be disposed beneath the core member 110, and the fan-out semiconductor package 100A may thus be mounted on the main board, or the like.

Figure 32:
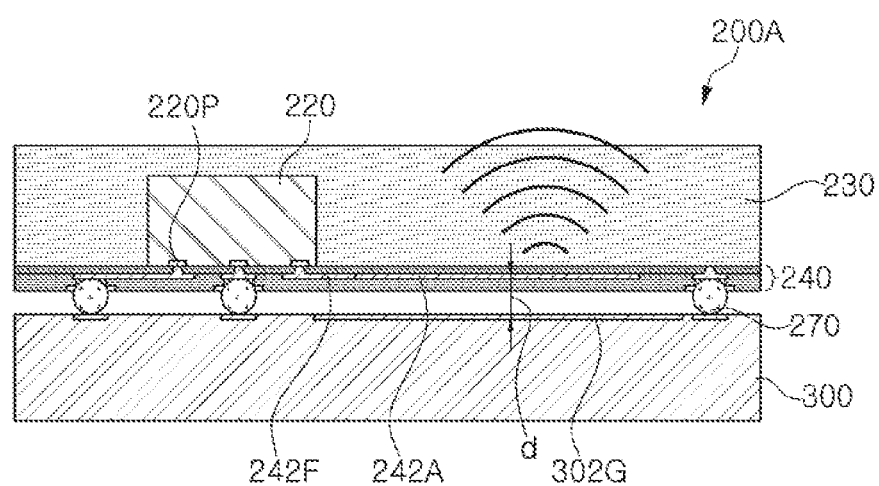
FIG. 32 is a schematic cross-sectional view illustrating an example in which a fan-out semiconductor package according to the related art is applied to a main board.

Meanwhile, in a case in which an antenna is formed together with a radio frequency integrated circuit (RFIC) in one package, a means of implementing an antenna, a ground face, a dielectric material, a feeding line, or the like, needs to be considered, in order to determine a resonance frequency and a bandwidth of the antenna. For example, a distance between the antenna and the ground face that has a sensitive influence on characteristics of the antenna, that is, a thickness of an air layer or a thickness of a dielectric material needs to be constantly maintained and managed in order to secure stable radiation characteristics of the antenna. In a case of the related art, as illustrated by way of example in FIG. 32, a manner of forming an antenna 242A on a redistribution layer 240 of a package 200A and forming a ground face 302G on a main board 300 has been used. In this case, a thickness or a distance d between the antenna 242A and the ground face 302G needs to be secured by a height of solder balls 270 of the package 200A. Therefore, when the package 200A is mounted on the main board 300, a thickness difference may be generated depending on a height level in which the solder ball collapse. In addition, in this case, a dielectric material is used as a material of the air layer, and a size of the antenna 242A is thus increased. In addition, in this case, a flux or a foreign material may be inserted into a space between the antenna 242A and the ground face 302G, resulting in significantly influence on characteristics of the antenna 242A. In addition, in this case, when heat is generated in the RFIC 220, it is difficult to secure a sufficient heat dissipation path, and thus, there is a limitation in using such a manner in a product that uses a large amount of power.

Figure 33:
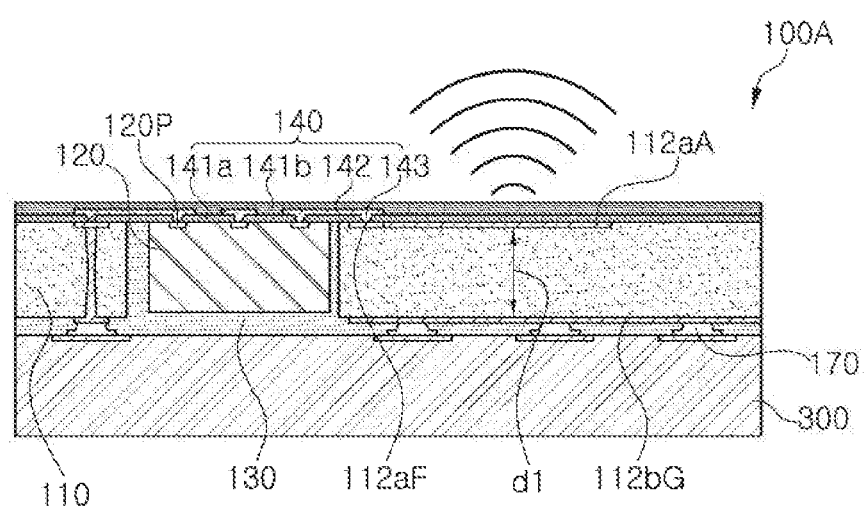
FIG. 33 is a schematic cross-sectional view illustrating an example in which a fan-out semiconductor package according to the present disclosure is applied to a main board.

On the other hand, in the fan-out semiconductor package 100A according to the exemplary embodiment, as illustrated by way of example in FIG. 33, the core member 110 is introduced and the antenna pattern 112aA and the ground pattern 112bG are formed on and beneath the core member 110, respectively. Therefore, even though the fan-out semiconductor package 100A is mounted on the main board 300, a stable design structure of the antenna pattern 112aA, that is, a distance d1 between the antenna pattern 112aA and the ground pattern 112bG may be stably secured regardless of a change in an external environment to maintain radiation characteristics of an antenna 112aG. In addition, a size of the antenna pattern 112aA may be reduced using a dielectric constant ($\varepsilon_1$) of the insulating layer 111 of the core member 110 to simplify an entire size of the fan-out semiconductor package 100A, resulting in improvement of spatial efficiency and reduction in a cost. In addition, deterioration of performance of the antenna pattern 112aA due to an influence of the foreign material in a space between the antenna pattern 112aA and the ground pattern 112bG may also be prevented. In addition, the electrical connection structures 170 are not limited to solder balls, and may be implemented in a very small thickness.

Particularly, in the fan-out semiconductor package 100A according to the exemplary embodiment, as illustrated by way of example in FIGS. 10 and 11, the core member 110 may be formed on the basis of a single substrate that has large areas, respectively, on upper and lower surfaces thereof and is not separated, the antenna pattern 112aA and the ground pattern 112bG may be formed on and beneath the core member 110, respectively, and the semiconductor chip 120 such as the RFIC, or the like, may then be disposed in the through-hole 110H of the core member 110. That is, the core member 110 may be a single member having a large area, and may not consist of a plurality of unit members. Therefore, a manufacturing process may be simple and a reduction in a cost may be possible. For example, a ground surface for an antenna pattern 112aA or various other signal patterns of the first wiring layer 112a may be solved by the ground pattern 112bG of the second wiring layer 112b. In addition, it may be more effective in controlling warpage of the fan-out semiconductor package 100A that the core member 110 formed on the basis of the single substrate as described above surrounds the semiconductor chip 120, and when a metal layer is formed on walls of the through-hole 110H of the core member 110 as described below, the metal layer may seamlessly surround the semiconductor chip 120, and a heat dissipation effect or an electromagnetic wave blocking effect may thus be very excellent.

Meanwhile, a term "connected" herein is a concept including a case in which components are electrically connected to each other or are connected in a signal manner as well as a case in which components are physically connected to each other. In addition, the term 'connected' is a concept including an indirect connection as well as a direct connection. In addition, a term "electrically connected or connected in a signal manner" is a concept including a physical connection and a physical disconnection.

Components of the fan-out semiconductor package 100A according to the exemplary embodiment will hereinafter be described in more detail.

The core member 110 may include the wiring layers 112a and 112b redistributing the connection pads 120P of the semiconductor chip 120 to thus reduce the number of layers of the connection member 140. If necessary, the core member 110 may improve rigidity of the fan-out semiconductor package 100A depending on a material of the insulating layer 111 constituting the core member 110, and secure uniformity of a thickness of the encapsulant 130. The fan-out semiconductor package 100A according to the exemplary embodiment may be utilized as a package-on-package (PoP) type package by the core member 110. That is, the core member 110 may be used as a connection member. The core member 110 may have the through-hole 110H. The semiconductor chip 120 may be disposed in the through-hole 110H to be spaced apart from the core member 110 by a predetermined distance. Side portions of the semiconductor chip 120 may be surrounded by the core member 110.

The core member 110 may include the insulating layer 111, the first wiring layer 112a disposed on the insulating layer 111, the second wiring layer 112b disposed beneath the insulating layer 111, and the vias 113 penetrating through the insulating layer 111 and connecting the first and second wiring layers 112a and 112b to each other. Thicknesses of the wiring layers 112a and 112b of the core member 110 may be greater than those of the redistribution layers 142 of the connection member 140. Since the core member 110 may have a thickness similar to or greater than that of the semiconductor chip 120, or the like, the wiring layers 112a and 112b may be formed at large sizes through a substrate process depending on a scale of the core member 110. On the other hand, the redistribution layers 142 of the connection member 140 may be formed at small sizes through a semiconductor process for thinness.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like.

The wiring layers 112a and 112b may redistribute the connection pads 120P of the semiconductor chip 120. In addition, the wiring layers 112a and 112b may include a specific pattern such as the antenna pattern 112aA. A material of each of the wiring layers 112a and 112b may be a conductive material such as copper (Cu), aluminum (Al), silver (Ag), tin (Sn), gold (Au), nickel (Ni), lead (Pb), titanium (Ti), or alloys thereof. The wiring layers 112a and 112b may perform various functions depending on designs of their corresponding layers. For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, frequency signals, and the like. In addition, the wiring layers 112a and 112b may include various pad patterns, and the like.

The first wiring layer 112a may include the antenna pattern 112aA and the feeding line 112aF connecting the antenna pattern 112aA to the connection pads 120P of the semiconductor chip 120, or the like. The antenna pattern 112aA may be connected to connection pads 120PS for a signal of the connection pads 120P through signal patterns 142S of the redistribution layer 142 in a signal manner. The first wiring layer 112a may further include a ground pattern 112aG having a plate shape, pads 112aPG for a ground connection, pads 112aPS for a signal connection, and the like. The second wiring layer 112b may include the ground pattern 112bG. The ground pattern 112bG may be connected to connection pads 120PG for a ground of the connection pads 120P through a ground pattern 142G of the redistribution layer 142. The ground pattern 112bG may be formed in a plate shape, and may occupy most of a lower surface of the insulating layer 111. The ground pattern 112bG may serve as a ground of the antenna pattern 112aA, the semiconductor chip 120, various signal patterns, and the like. The second wiring layer 112b may include electrical connection structure pads 112bPS for a signal connection, electrical connection structure pads 112bPG for a ground connection, and the like, in addition to the ground pattern 112bG.

As described above, the fan-out semiconductor package 100A according to the exemplary embodiment may have the antenna pattern 112aA and the ground patterns 112bG disposed on opposite surfaces of the core member 110. Therefore, a distance between the antenna pattern 112aA and the ground pattern 112bG may be stably secured to maintain radiation characteristics of the antenna 112aG, and the size of the antenna pattern 112aA may be reduced using the dielectric constant of a dielectric in the core member 110, that is, the insulating layer 111, to simplify the entire size of the fan-out semiconductor package 100A, resulting in improvement of spatial efficiency and reduction in a cost. In addition, deterioration of performance of the antenna pattern 112aA due to the influence of the foreign material in the space between the antenna pattern 112aA and the ground pattern 112bG may also be prevented, and the electrical connection structures 170 are not limited to solder balls, and may be thinned.

The vias 113 may connect the wiring layers 112a and 112b formed on different layers to each other, resulting in an electrical path in the core member 110. The vias 113 may include vias 113S for a signal connection, vias 113G for a ground connection, and the like. A material of each of the vias 113 may be a conductive material such as copper (Cu), aluminum (Al), silver (Ag), tin (Sn), gold (Au), nickel (Ni), lead (Pb), titanium (Ti), or alloys thereof. Each of the vias 113 may be completely filled with the conductive material, or the conductive material may be formed along a wall of each of via holes. In addition, each of the vias 113 may have any known shape such as a sandglass shape, a cylindrical shape, and the like.

The semiconductor chip 120 may be an integrated circuit (IC) in a bare state, provided in an amount of several hundreds to several millions of elements or more integrated in a single chip. The integrated circuit (IC) may be, for example, a radio frequency integrated circuit (RFIC). That is, the fan-out semiconductor package 100A according to the exemplary embodiment may be a package in which the RFIC and a millimeter wave/5G antenna are integrated with each other. The semiconductor chip 120 may include a body on which various circuits are formed, and the connection pads 120P may be formed on an active surface of the body. The body may be formed on the basis of, for example, an active wafer. In this case, silicon (Si), germanium (Ge), gallium arsenide (GaAs), or the like, may be used as a basic material of the body. The connection pads 120P may connect the semiconductor chip 120 to other components, and a material of each of the connection pads 120P may be a conductive material such as aluminum (Al), but is not limited thereto.

The active surface of the semiconductor chip 120 refers to a surface of the semiconductor chip 120 on which the connection pads 120P are disposed, and the inactive surface of the semiconductor chip 120 refers to a surface of the semiconductor chip 120 opposing the active surface. As an example, the semiconductor chip 120 may be disposed in face-up form so that the active surface thereof is directed toward the top. In this case, the connection member 140 may also be disposed on the core member 110. In addition, the first wiring layer 112a may be formed on a level above the second wiring layer 112b. Therefore, the connection pads 120PS for a signal of the connection pads 120P of the semiconductor chip 120 may be connected to the feeding line 112aF of the antenna pattern 112aA through a redistribution layer 142S for a signal and vias 143S of the connection member 140. Resultantly, a distance from the connection pads 120PS for a signal to the feeding line 112aF of the antenna pattern 112aA may be significantly reduced. Therefore, low insertion loss may be implemented.

The encapsulant 130 may be configured to protect the semiconductor chip 120 and provide an insulation region. An encapsulation form of the encapsulant 130 is not particularly limited, and may be a form in which the encapsulant 130 surrounds at least portions of the semiconductor chip 120. For example, the encapsulant 130 may cover a lower surface of the core member 110, and cover side surface and the inactive surface of the semiconductor chip 120. In addition, the encapsulant 130 may fill at least portions of the through-hole 110H. The certain materials of the encapsulant 130 are not particularly limited, but may be an insulating material such as ABF. Alternatively, a photoimagable encapsulant (PIE) may be used as the material of the encapsulant 130.

The connection member 140 may serve to connect the fan-out semiconductor package 100A according to the exemplary embodiment to an external component. In addition, the connection member 140 may redistribute the connection pads 120P of the semiconductor chip 120. The connection member 140 may include a first insulating layer 141a, a redistribution layer 142 formed on the first insulating layer 141a, vias 143 formed in the first insulating layer 141a and connecting the redistribution layer 142 to patterns formed on another layer, and a second insulating layer 141b disposed on the first insulating layer 141a and covering the redistribution layer 142.

A material of the first insulating layer 141a may be an insulating material. In this case, the insulating material may be a photosensitive insulating material such as a PID resin. In this case, the first insulating layer 141a may be formed to have a smaller thickness, and a fine pitch of the vias 143 may be achieved more easily. When the first insulating layers 141a are multiple layers, materials of the first insulating layers 141a may be the same as each other, and may also be different from each other, if necessary. When the first insulating layers 141a are the multiple layers, the first insulating layers 141a may be integrated with each other depending on a process, such that a boundary therebetween may also not be apparent. A material of the second insulating layer 141b may also be an insulating material. In this case, the insulating material may be ABF, or the like. That is, the outermost layer of the connection member 140 may be a passivation layer.

The redistribution layer 142 may serve to redistribute the connection pads 120P of the semiconductor chip 120, and a material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 142 may include ground lines 142G, signal lines 142S, and the like. In addition, the redistribution layer 142 may include pads 142PG for a ground, pads 142PS for a signal, and the like.

The vias 143 may connect the redistribution layer 142, the wiring layer 112a, and the like, formed on different layers to each other, resulting in an electrical path in the connection member 140. A material of each of the vias 143 may be a conductive material such as copper (Cu), aluminum (Al), silver (Ag), tin (Sn), gold (Au), nickel (Ni), lead (Pb), titanium (Ti), or alloys thereof. The each of vias 143 may be completely filled with the conductive material, or the conductive material may also be formed along a wall of each of the vias. In addition, each of the vias 143 may have any known shape such as a tapered shape, a cylindrical shape, and the like. The vias 143 may also include vias 143G for a ground, vias 143S for a signal, and the like.

The underbump metal layer 160 may be additionally configured to improve connection reliability of the electrical connection structures 170 to improve board level reliability of the fan-out semiconductor package 100A. The underbump metal layer 160 may be connected to various pads 112aPG and 112aPS for electrical connection structures, of the first wiring layer 112a of the connection member 140 exposed through openings of the encapsulant 130. The underbump metal layer 160 may be formed in the openings of the encapsulant 130 by the known metallization method using the known conductive material such as a metal, but is not limited thereto.

The electrical connection structures 170 may be additionally configured to physically or electrically externally connect the fan-out semiconductor package 100A. For example, the fan-out semiconductor package 100A may be mounted on the main board of the electronic device through the electrical connection structures 170. Each of the electrical connection structures 170 may be formed of a low melting point metal, for example, a solder formed of tin (Sn)-aluminum (Al)-copper (Cu) alloys, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several millions according to the number of connection pads 120P, or may be provided in an amount of several tens to several millions or more or several tens to several millions or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

FIGS. 12A through 12D are schematic views illustrating kinds of antenna patterns that may be used in the fan-out semiconductor package of FIG. 9.

Figure 12A:
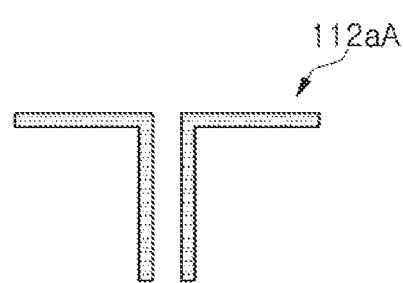
FIGS. 12A through 12D are schematic views illustrating kinds of antenna patterns that may be used in the fan-out semiconductor package of FIG. 9.
Figure 12B:
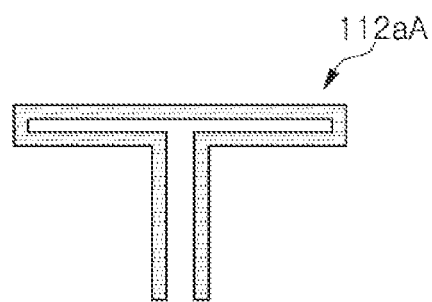
Figure 12C:
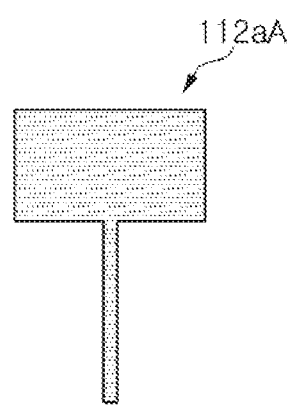
Figure 12D:
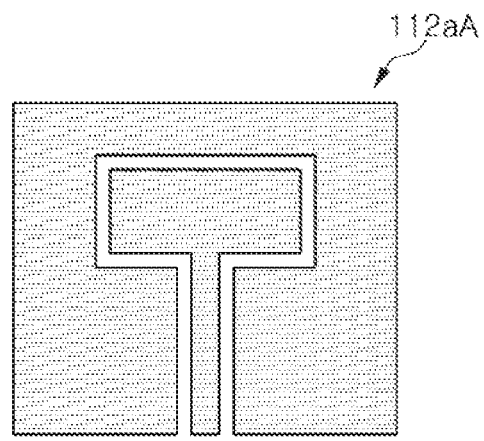

Referring to FIGS. 12A through 12D, an antenna pattern 112aA may be a dipole antenna as illustrated in FIG. 12a, a folded dipole antenna as illustrated in FIG. 12B, a patch antenna illustrated in FIG. 12C, or a coplanar patch antenna as illustrated in FIG. 12D. However, the antenna pattern is not limited thereto, but may be a ring antenna, a loop antenna, or the like, and the respective antennas may have various shapes such as a rectangular shape, a square shape, a circular shape, a radial shape, and the like. That is, the antenna pattern 112aA may implement millimeter wave/5G, and a kind or a type of antenna pattern 112aA is not limited.

Figure 13:
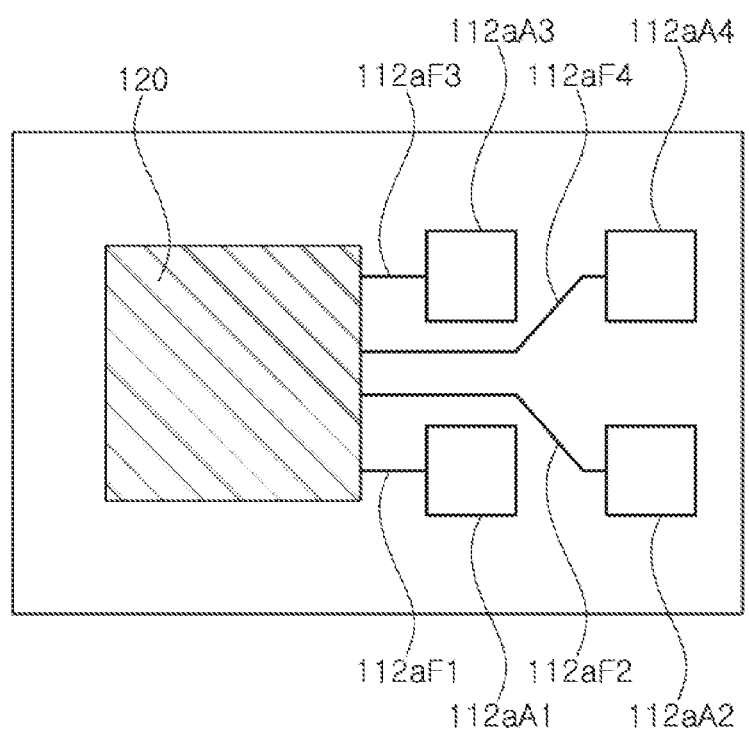
FIG. 13 is a schematic view illustrating a modified example of an antenna pattern that may be used in the fan-out semiconductor package of FIG. 9.

FIG. 13 is a schematic view illustrating a modified example of an antenna pattern that may be used in the fan-out semiconductor package of FIG. 9.

Referring to FIG. 13, an antenna pattern 112aA may include a plurality of patch antennas 112aA1, 112aA2, 112aA3, and 112aA4. The respective patch antennas 112aA1 to 112aA4 may be connected to the respective connection pads of a semiconductor chip 120 for a signal through the respective feeding lines 112aF1, 112aF2, 112aF3, and 112aF4 in a signal manner. The respective patch antennas 112aA1, 112aA2, 112aA3, and 112aA4 may include transmit (Tx) antennas and receive (Rx) antennas of which the numbers are not particularly limited.

FIGS. 14A through 14F are schematic views illustrating an example of processes of manufacturing the fan-out semiconductor package of FIG. 9.

Figure 14A:
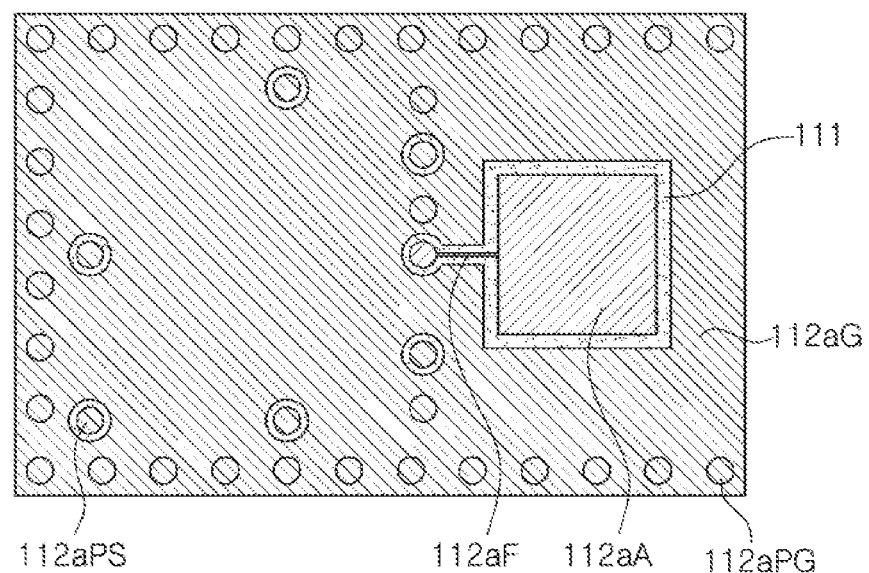
FIGS. 14A through 14F are schematic views illustrating an example of processes of manufacturing the fan-out semiconductor package of FIG. 9.
Figure 14A:
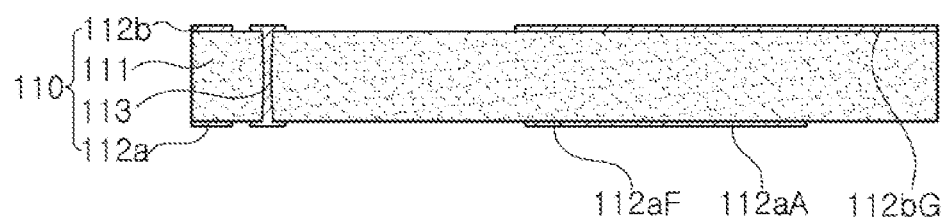

Referring to FIG. 14A, the core member 110 may be prepared. The core member 110 may be prepared using a single large area substrate such as a copper clad laminate (CCL). That is, the core member 110 may be prepared by forming the first wiring layer 112a and the second wiring layer 112b on opposite surfaces of the insulating layer 111, respectively, using the CCL and forming the vias 113 penetrating through the insulating layer 111. As the first wiring layer 112a, the antenna pattern 112aA, the feeding line 112aF, various pads 112aPS and 112aPG, and the like, may be formed. As the second wiring layer 112b, the ground pattern 112bG, various pads 112bPS, 112bPG, and the like, may be formed. As the vias 113, the vias 113G for a ground connection, the vias 113S for a signal connection, and the like, may be formed. In addition, patterns, pads, vias, and the like, for power may be formed. The wiring layers 112a and 112b may be formed by the known plating process, and the vias 113 may be formed by forming via holes with a laser drill, or the like, and then filling the via holes by plating.

Figure 14B:
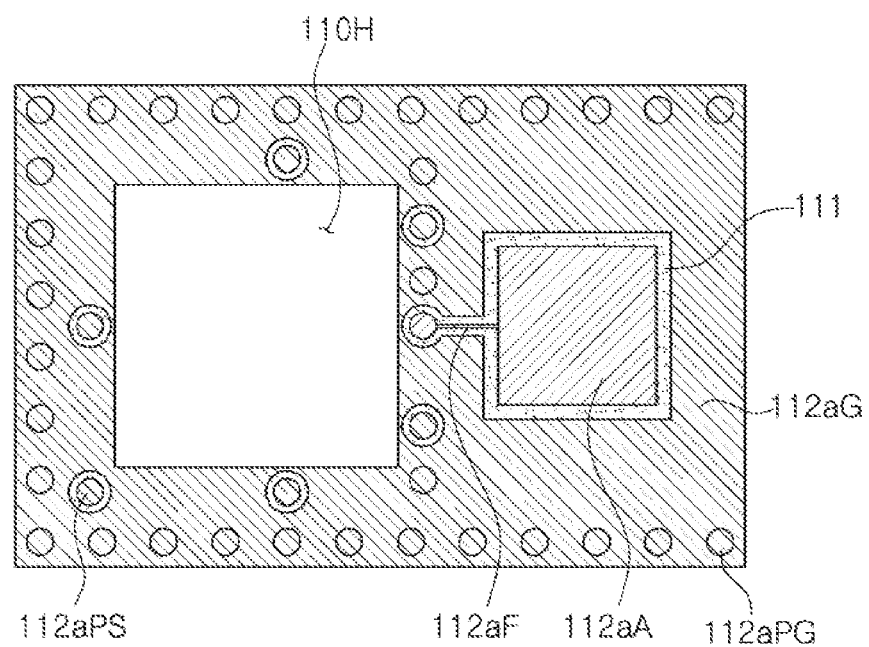
Figure 14B:
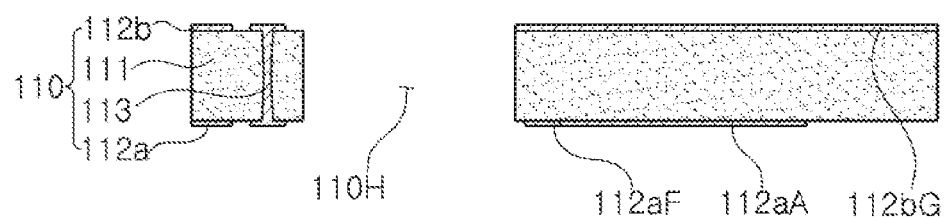

Referring to FIG. 14B, the through-hole 110H may be formed in the core member 110. The through-hole 110H may be formed using a mechanical drill, a laser drill, or the like. In this case, a desmear process may be performed as a subsequent process. Alternatively, the through-hole 110H may be formed by a sand blast method, or the like. The through-hole 110H may penetrate between upper and lower surface of the insulating layer 111. A size of the through-hole 110H may be appropriately designed depending on a size of the semiconductor chip 120. If necessary, after the through-hole 110H is formed, the metal layer may be formed on the walls of the through-hole 110H and be then connected to the ground, as described below. In this case, the metal layer may also be used as the ground.

Figure 14C:
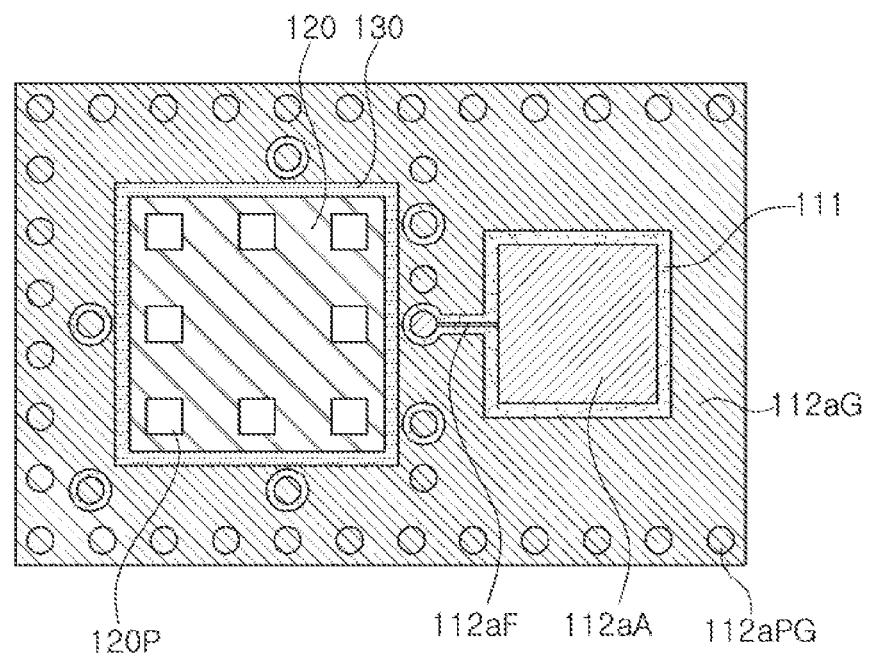
Figure 14C:
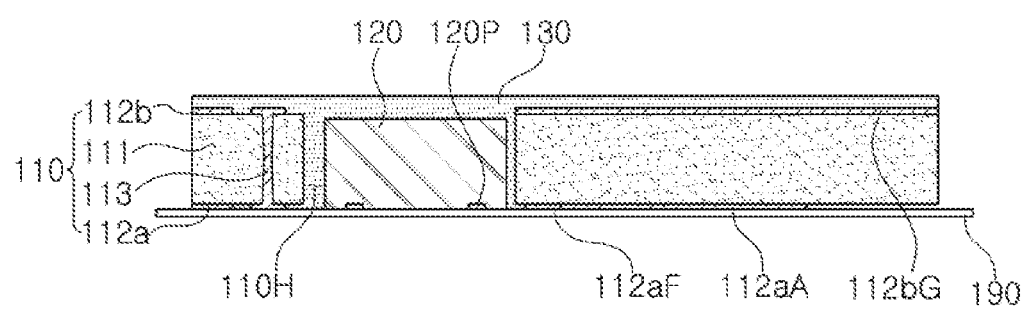

Referring to FIG. 14C, the semiconductor chip 120 may be disposed using an adhesive film 190, and may be encapsulated by the encapsulant 130. In detail, the core member 110 in which the through-hole 110H is formed may be attached to the adhesive film 190 such as a tape, or the like, so that the first wiring layer 112a is directed toward the adhesive film 190, the semiconductor chip 120 may be attached to the adhesive film 190 exposed through the through-hole 110H so that the active surface of the semiconductor chip 120 is directed toward the adhesive film 190, and the semiconductor chip 120 may thus be encapsulated by the encapsulant 130. The encapsulant 130 may be formed by stacking a film in a b-stage and then hardening the film or be formed by applying a liquid-phase material for forming the encapsulant 130 by the known coating method and then hardening the liquid-phase material.

Figure 14D:
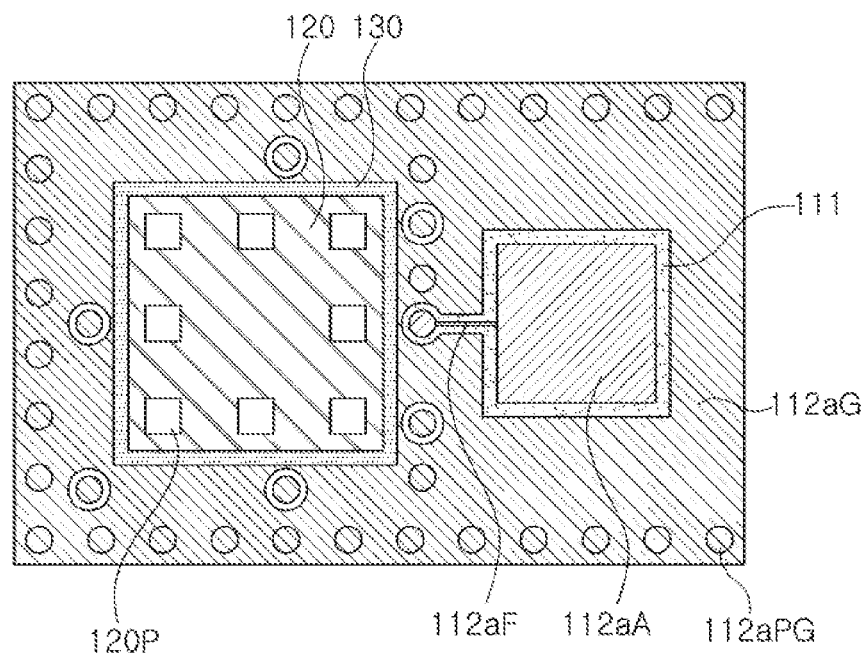
Figure 14D:
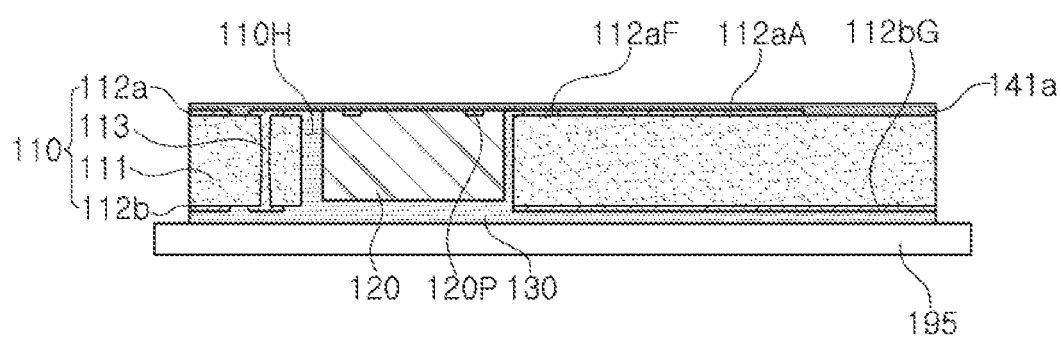

Referring to FIG. 14D, the adhesive film 190 may be removed, and the first insulating layer 141a may be formed on a surface of the core member 110 on which the first wiring layer 112a is formed and the active surface of the semiconductor chip 120. The first insulating layer 141a may be formed by stacking a PID in a b-stage and then hardening the PID or be formed by applying a material for forming a PID and then hardening the material. This process may be performed in a state in which the encapsulant 130 is attached to a carrier film 195 such as DCF, or the like.

Figure 14E:
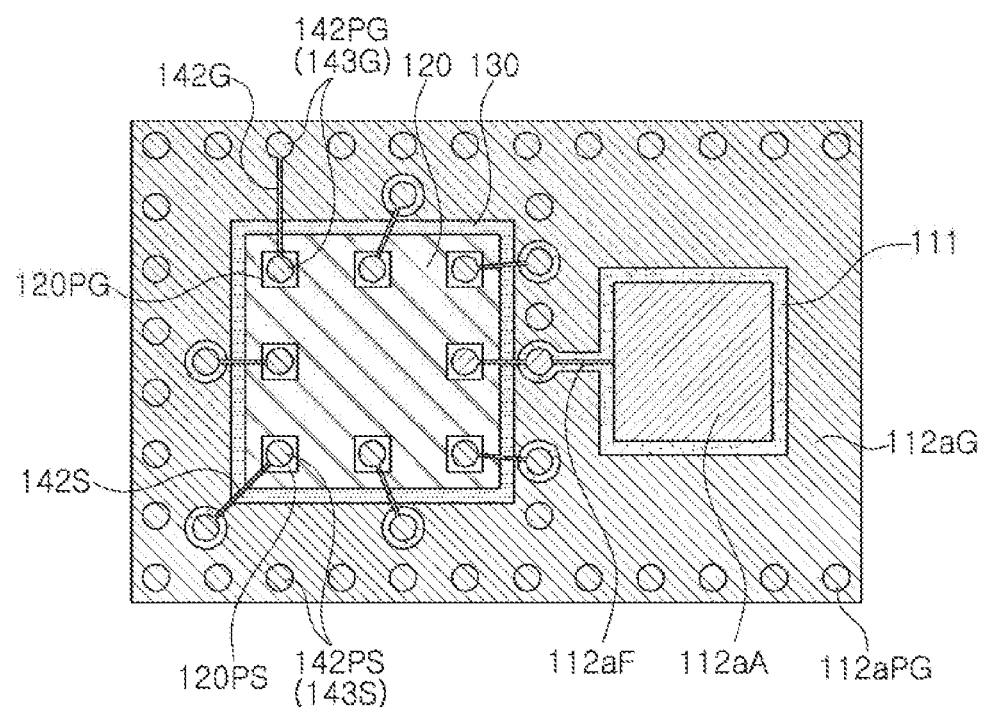
Figure 14E:
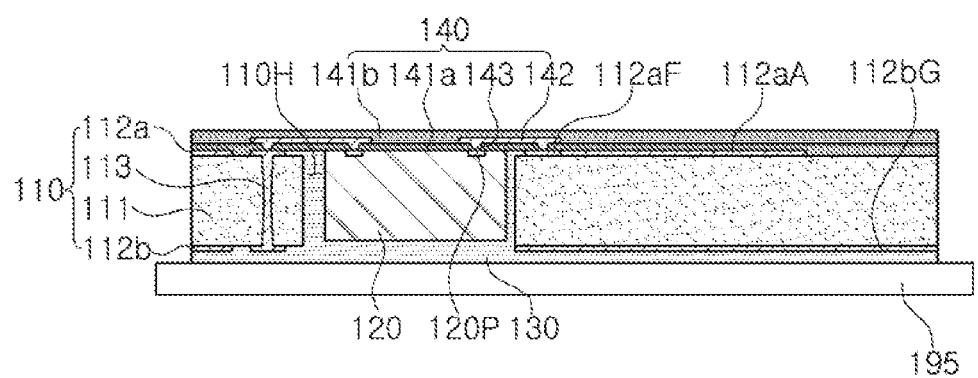

Referring to FIG. 14E, the redistribution layer 142 and the vias 143 may be formed on and in the first insulating layer 141a, and the second insulating layer 141b may be formed on the first insulating layer 141a and the redistribution layer 142 to form the connection member 140. The redistribution layer 142 may include the signal lines 142S, the ground lines 142G, the pads 142PS for a signal, the pads 142PG for a ground, and the like. The vias 143 may also include the vias 143S for a signal, the vias 143G for a ground, and the like. Meanwhile, the redistribution layer 142 may be formed by the known plating process, and the vias 143 may be formed by forming via holes by a photolithography method and then filling the via holes by plating.

Figure 14F:
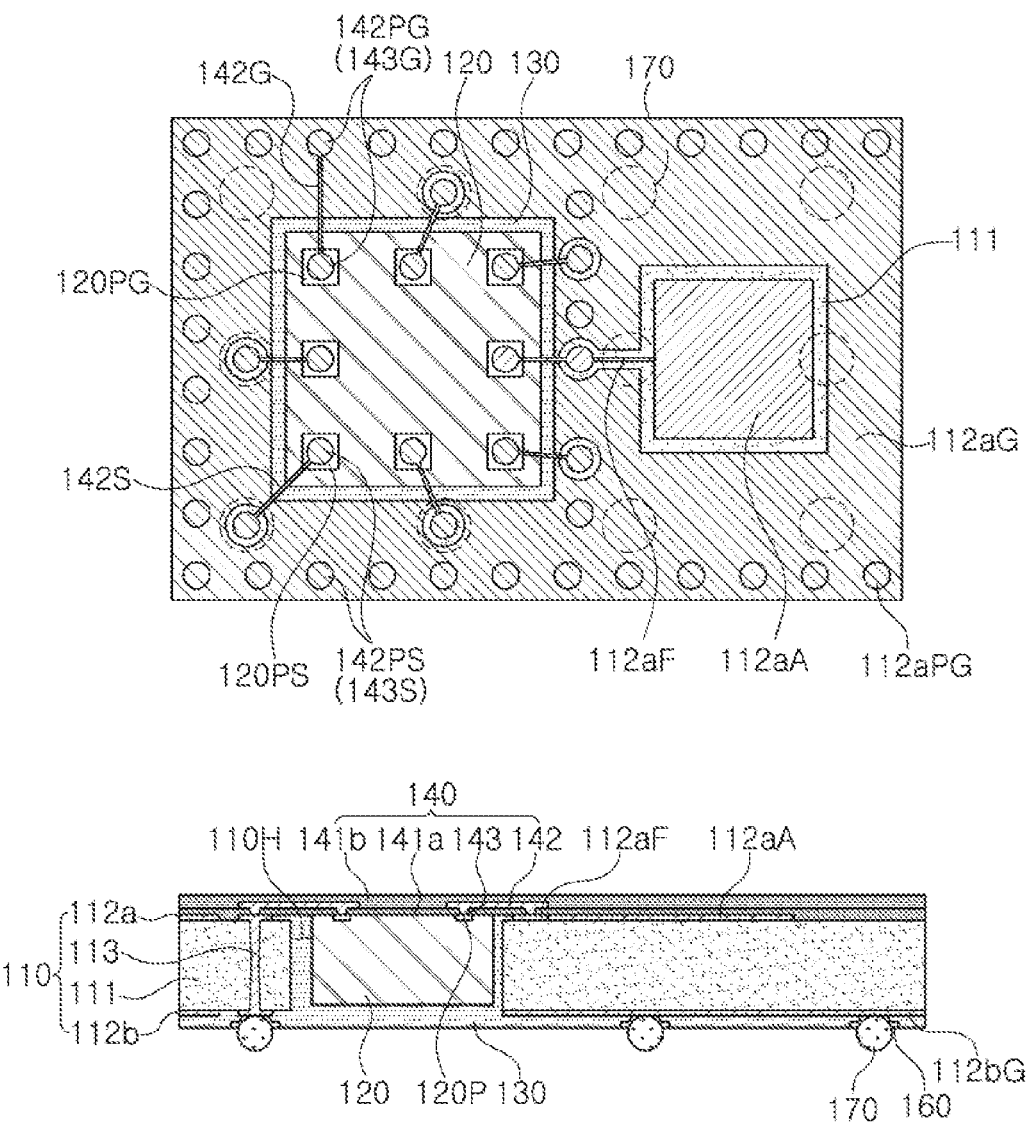

Referring to FIG. 14F, the carrier film 195 may be removed, and the underbump metal layer 160 and the electrical connection structures 170 may be formed. In detail, after the carrier film 195 is removed, the encapsulant 130 may be opened by a laser beam, or the like, to open various pads 112aPG and 112aPS of the second wiring 112b of the core member 110, and the underbump metal layer 160 and the electrical connection structures 170 may be sequentially formed. A plurality of fan-out semiconductor packages 100A may be formed through a single large area substrate by a series of process, and when the plurality of fan-out semiconductor packages 100A are sawed and separated from one another by a dicing process, the plurality of fan-out semiconductor packages 100A may be manufactured by performing processes one time.

Figure 15:
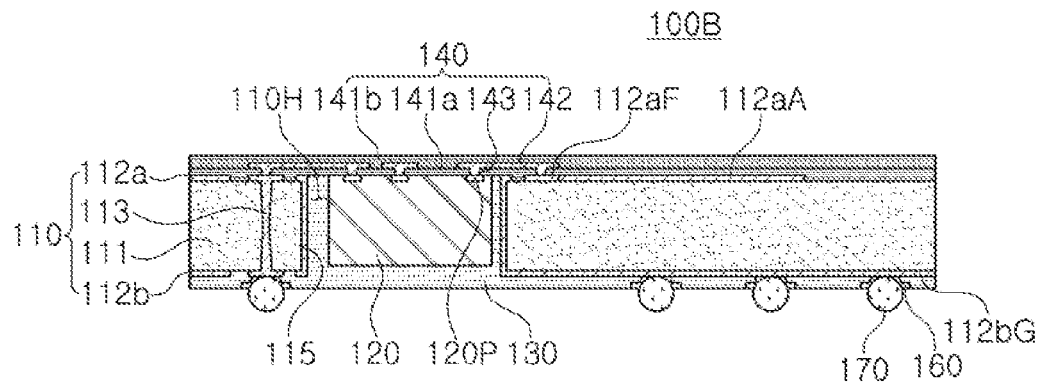
FIG. 15 is a schematic cross-sectional view illustrating another example of a fan-out semiconductor package.

FIG. 15 is a schematic cross-sectional view illustrating another example of a fan-out semiconductor package.

Figure 16:
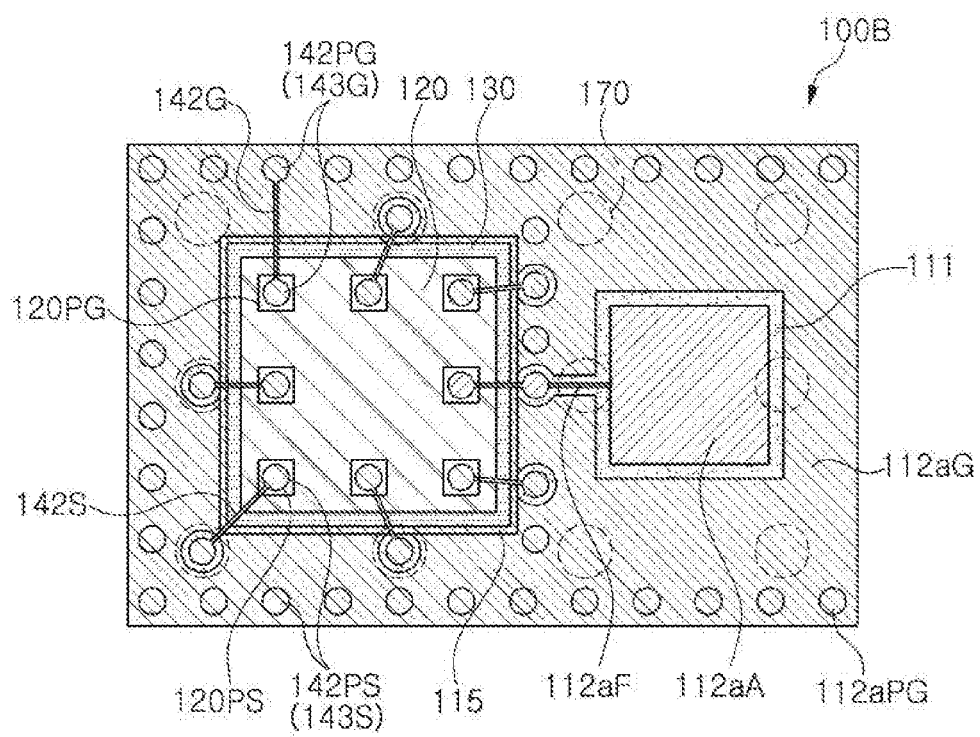
FIG. 16 is a schematic plan view illustrating the fan-out semiconductor package of FIG. 15 when viewed from above.

FIG. 16 is a schematic plan view illustrating the fan-out semiconductor package of FIG. 15 when viewed from above.

Referring to FIGS. 15 and 16, a fan-out semiconductor package 100B according to another exemplary embodiment in the present disclosure may further include a metal layer 115 disposed on walls of a through-hole 110H. The metal layer 115 may include a conductive material such as copper (Cu), aluminum (Al), silver (Ag), tin (Sn), gold (Au), nickel (Ni), lead (Pb), titanium (Ti), or alloys thereof. The metal layer 115 may be connected to a ground pattern 112bG of a second wiring layer 112b to be thus used as a ground. When a first wiring layer 112a has a ground pattern 112aG, the metal layer 115 may also be connected to the ground pattern 112aG. Since the metal layer 115 is formed on the walls of the through-hole 110 of a core member 110 using a single large area substrate, the metal layer 115 may seamlessly surround side portions of a semiconductor chip 120, and a heat dissipation effect and an electromagnetic wave blocking effect may thus be excellent.

Other components overlap those described above, and thus, detailed descriptions thereof are omitted. In addition, processes of manufacturing the fan-out semiconductor package 100B according to another exemplary embodiment are substantially the same as those of manufacturing the fan-out semiconductor package 100A according to the exemplary embodiment described above except that the metal layer 115 is formed on the walls of the through-hole 110H by the plating, and a detailed description thereof is thus omitted.

Figure 17:
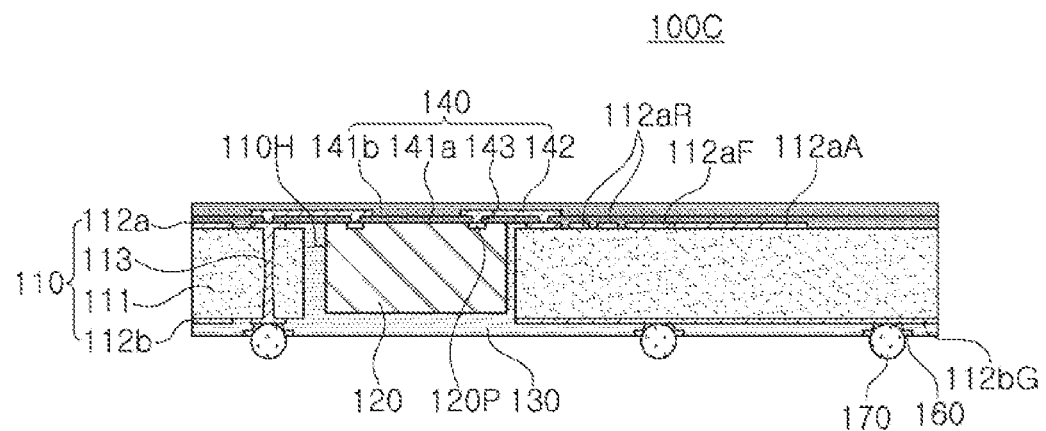
FIG. 17 is a schematic cross-sectional view illustrating another example of a fan-out semiconductor package.

FIG. 17 is a schematic cross-sectional view illustrating another example of a fan-out semiconductor package.

Figure 18:
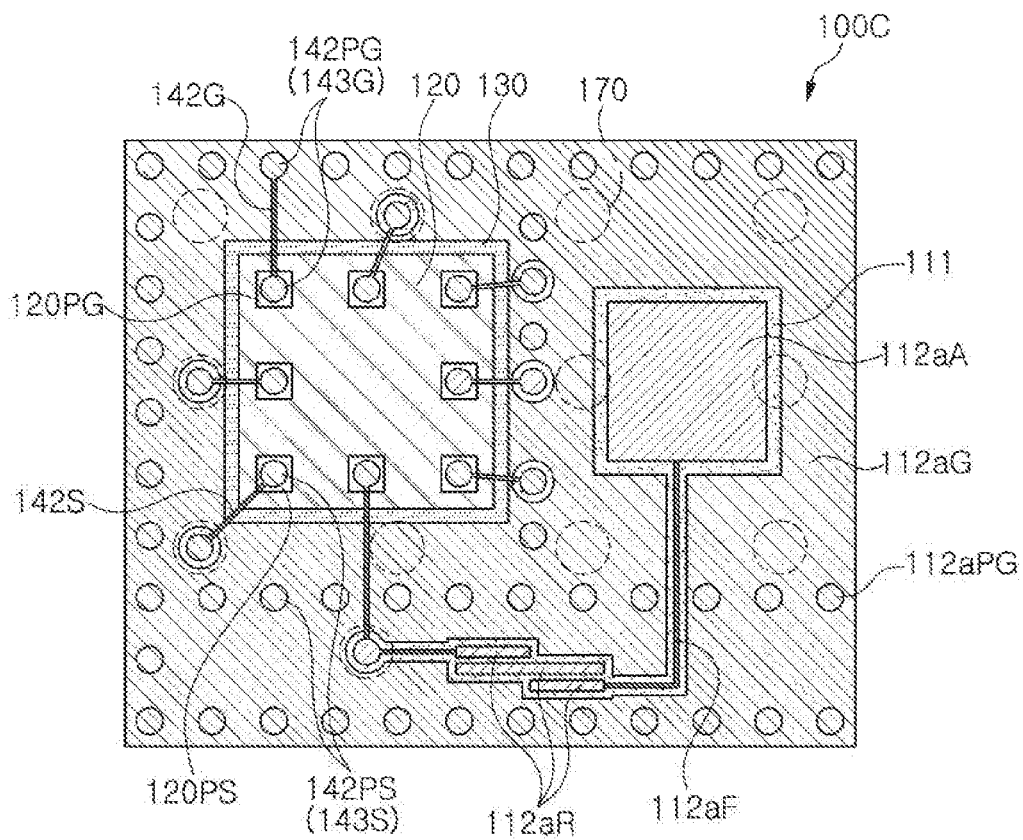
FIG. 18 is a schematic plan view illustrating the fan-out semiconductor package of FIG. 17 when viewed from above.

FIG. 18 is a schematic plan view illustrating the fan-out semiconductor package of FIG. 17 when viewed from above.

Referring to FIGS. 17 and 18, in a fan-out semiconductor package 100C according to another exemplary embodiment, a first wiring layer 112a of a core member 110 may include filter patterns 112aR. The filter patterns 112aR may be a strip type, a microstrip type, or the like, but are not limited thereto. The filter pattern 112aR may have one end connected to a connection pad 120PS for a signal of connection pads 120P of a semiconductor chip 120 and the other end connected to a feeding line 112aF of an antenna pattern 112aA. The connection pad 120PS for a signal and the feeding line 112aF may be connected to each other through the filter pattern 112aR in a signal manner, resulting in removal of various types of noise. Meanwhile, since the core member 110 is formed on the basis of a single large area substrate, the filter patterns 112aR and the feeding line 112aF may be coplanar with each other, and be thus connected to each other by only a pattern without using a separate via. A ground pattern 112bG of a second wiring layer 112b may serve as a ground for the filter patterns 112aR.

Other components overlap those described above, and thus, detailed descriptions thereof are omitted. In addition, processes of manufacturing the fan-out semiconductor package 100C according to another exemplary embodiment are substantially the same as those of manufacturing the fan-out semiconductor package 100A according to the exemplary embodiment described above except that the filter patterns 112aR are formed when the first wiring layer 112a is formed, and a detailed description thereof is thus omitted. Meanwhile, the metal layer 115 described in the fan-out semiconductor package 100B according to another exemplary embodiment may also be applied to the fan-out semiconductor package 100C according to another exemplary embodiment.

Figure 19:
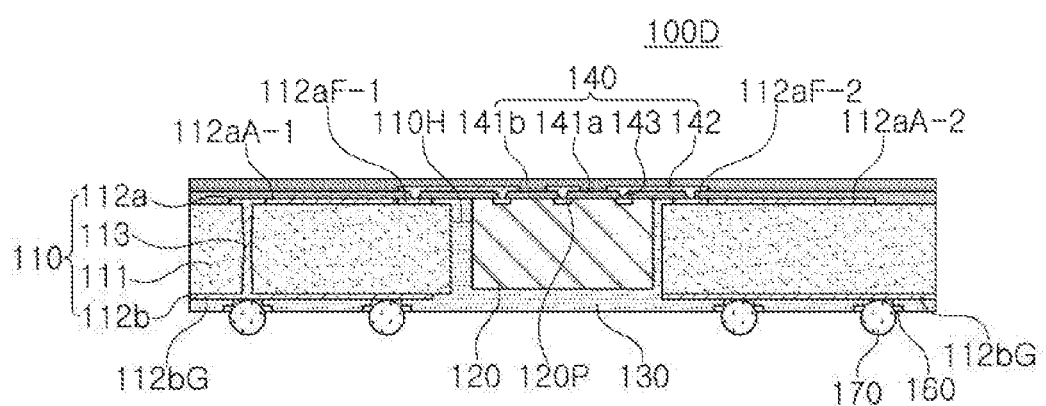
FIG. 19 is a schematic cross-sectional view illustrating another example of a fan-out semiconductor package.

FIG. 19 is a schematic cross-sectional view illustrating another example of a fan-out semiconductor package.

FIGS. 20A through 20D are schematic plan views illustrating various examples of the fan-out semiconductor package of FIG. 19 when viewed from above.

Figure 20A:
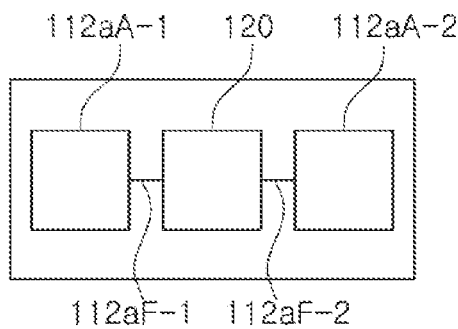
FIGS. 20A through 20D are schematic plan views illustrating various examples of the fan-out semiconductor package of FIG. 19 when viewed from above.
Figure 20B:
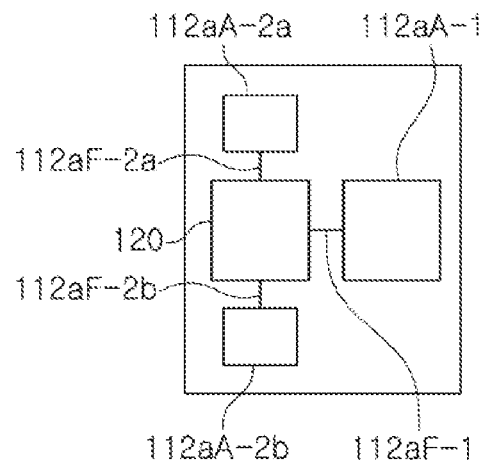
Figure 20C:
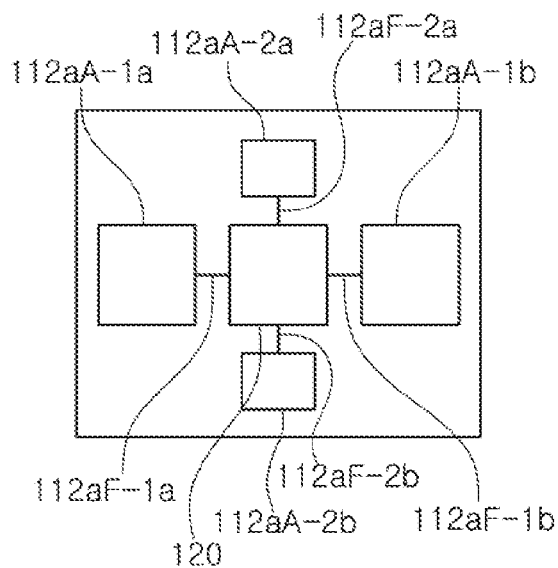
Figure 20D:
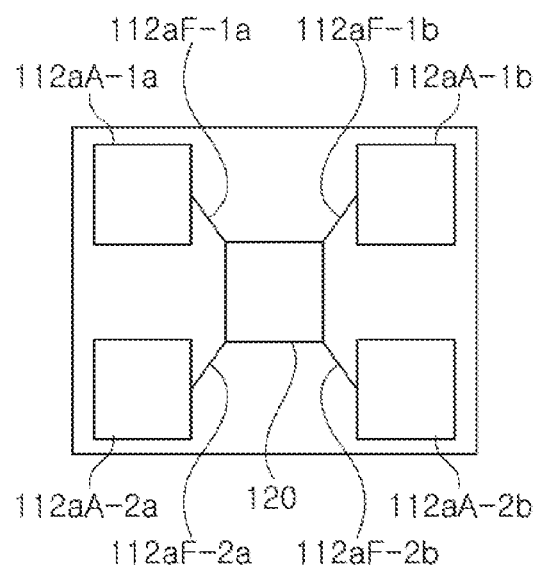

Referring to FIGS. 19 through 20D, in a fan-out semiconductor package 100D according to another exemplary embodiment, an antenna pattern may include receive (Rx) antennas and transmit (Tx) antennas, and the receive (Rx) antennas and the transmit (Tx) antennas may be separated from each other. For example, as illustrated in FIG. 20A, a transmit antenna 112aA-1 may be disposed at the left in relation to a semiconductor chip 120, a receive antenna 112aA-2 may be disposed at the right in relation to the semiconductor chip 120, and the transmit antenna 112aA-1 and the receive antenna 112aA-2 may be connected to the semiconductor chip 120 through feeding lines 112aF-1 and 112aF-2, respectively, in a signal manner. Alternatively, as illustrated in FIG. 20B, a receive antenna 112aA-1 may be disposed at the right in relation to a semiconductor chip 120, transmit antennas 112aA-2a and 112aA-2b may be disposed above and below the semiconductor chip 120, respectively, and the receive antenna 112aA-1 and the transmit antennas 112aA-2a and 112aA-2b may be connected to the semiconductor chip 120 through feeding lines 112aF-1, 112aF-2a, and 112aF-2b, respectively, in a signal manner. Alternatively, as illustrated in FIG. 20C, transmit antennas 112aA-1a and 112aA-1b may be disposed at the left and the right in relation to a semiconductor chip 120, respectively, receive antennas 112aA-2a and 112aA-2b may be disposed above and below the semiconductor chip 120, respectively, and the transmit antennas 112aA-1a and 112aA-1b and the receive antennas 112aA-2a and 112aA-2b may be connected to the semiconductor chip 120 through feeding lines 112aF-1a, 112aF-1b, 112aF-2a, and 112aF-2b, respectively, in a signal manner. Alternatively, as illustrated in FIG. 20D, transmit antennas 112aA-1a and 112aA-1b may be disposed at a left upper corner and a right upper corner in relation to a semiconductor chip 120, respectively, receive antennas 112aA-2a and 112aA-2b may be disposed at a left lower corner and a right lower corner with respect to the semiconductor chip 120, respectively, and the transmit antennas 112aA-1a and 112aA-1b and the receive antennas 112aA-2a and 112aA-2b may be connected to the semiconductor chip 120 through feeding lines 112aF-1a, 112aF-1b, 112aF-2a, and 112aF-2b, respectively, in a signal manner. That is, the transmit (Tx) antennas and the receive (Rx) antennas may be disposed in various forms.

Other components overlap those described above, and thus, detailed descriptions thereof are omitted. In addition, processes of manufacturing the fan-out semiconductor package 100D according to another exemplary embodiment are substantially the same as those of manufacturing the fan-out semiconductor package 100A according to the exemplary embodiment described above except that the antenna pattern is formed in various forms when the first wiring layer 112a is formed, and a detailed description thereof is thus omitted. Meanwhile, the metal layer 115 described in the fan-out semiconductor package 100B according to another exemplary embodiment or the filter patterns 112aR described in the fan-out semiconductor package 100C according to another exemplary embodiment may also be applied to the fan-out semiconductor package 100D according to another exemplary embodiment.

Figure 21:
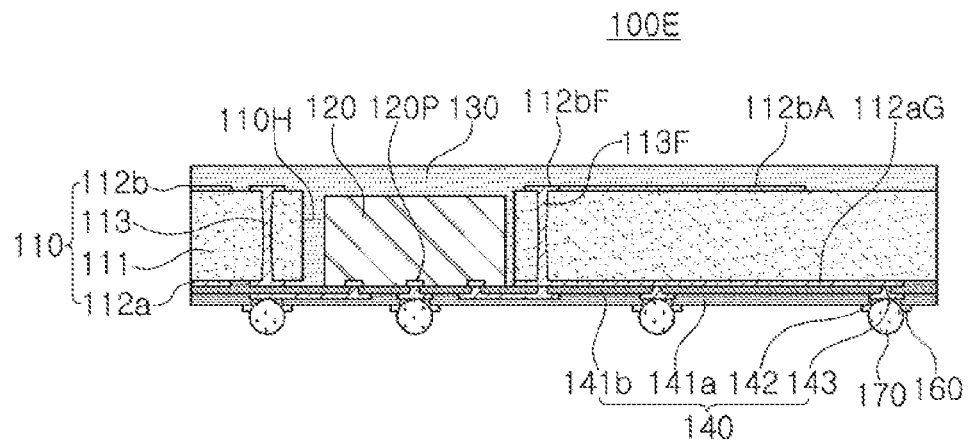
FIG. 21 is a schematic cross-sectional view illustrating another example of a fan-out semiconductor package.

FIG. 21 is a schematic cross-sectional view illustrating another example of a fan-out semiconductor package.

Figure 22:
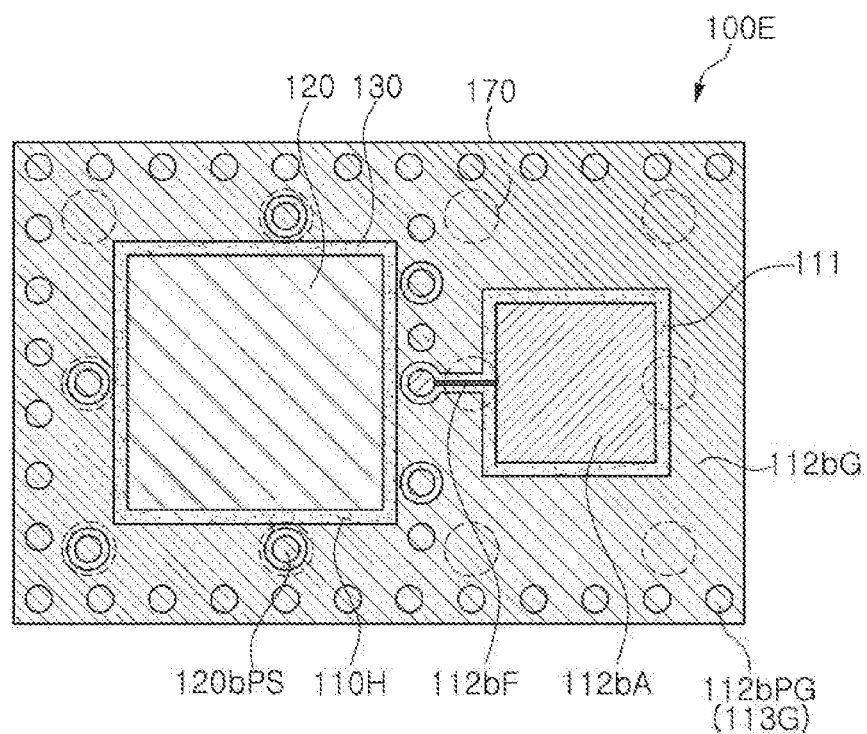
FIG. 22 is a schematic plan view illustrating the fan-out semiconductor package of FIG. 21 when viewed from above.

FIG. 22 is a schematic plan view illustrating the fan-out semiconductor package of FIG. 21 when viewed from above.

Figure 23:
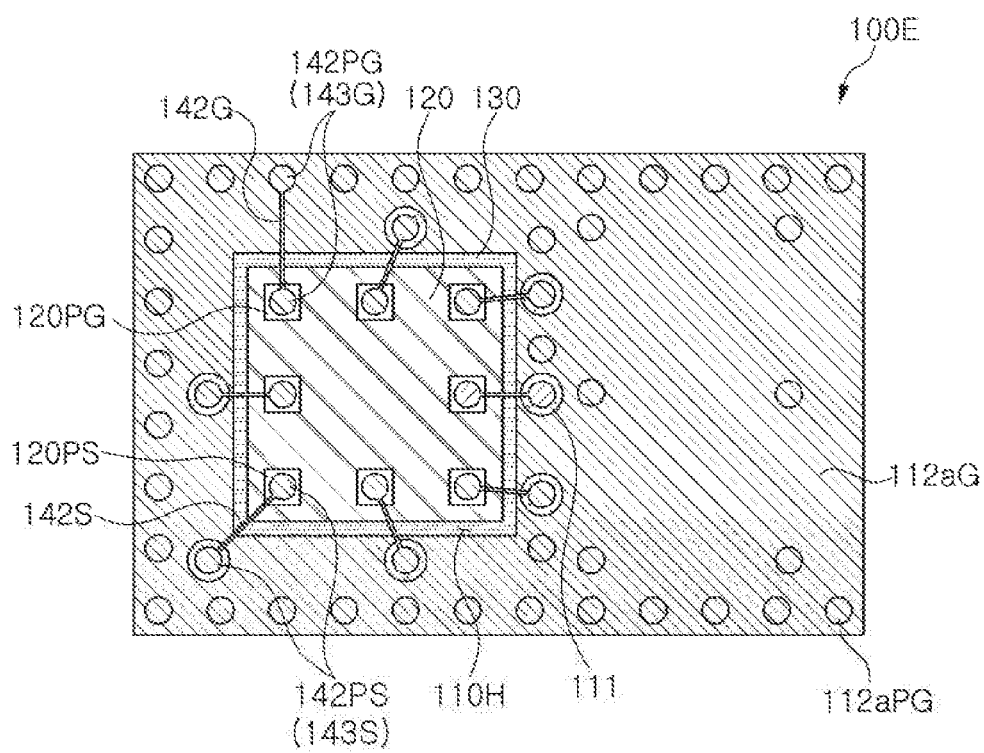
FIG. 23 is a schematic plan view illustrating the fan-out semiconductor package of FIG. 21 when viewed from below.

FIG. 23 is a schematic plan view illustrating the fan-out semiconductor package of FIG. 21 when viewed from below.

Referring to FIGS. 21 through 23, in a fan-out semiconductor package 100E according to another exemplary embodiment, a semiconductor chip 120 may be disposed in face-down form. In this case, a connection member 140 may be disposed beneath a core member 110, and an underbump metal layer 160 and electrical connection structures 170 may be formed beneath the connection member 140 to be connected to a redistribution layer 142 of the connection member 140. Meanwhile, a second wiring layer 112*b* of the core member 110 may be disposed on a level above a first wiring layer 112*a* of the core member 110, the first wiring layer 112*a* may include a ground pattern 112*a*G, the second wiring layer 112*b* may include an antenna pattern 112*b*A and a feeding line 112*b*F, and a via 113 may include a feeding line 113F. In such a disposition form, a connection pad 120PS for a signal of the semiconductor chip 120 and the antenna pattern 112*b*A may be connected to each other through a redistribution layer 142S for a signal and a via 143S for a signal of the connection member 140 and a via pad 112*b*PS for a signal of the second wiring layer 112*b* and the feeding line 113F of the via 113 of the core member 110 in a signal manner, such that a path may become somewhat long, but heat may be easily transferred to the main board, or the like, via the connection member 140 through the active surface of the semiconductor chip 120, and heat dissipation characteristics may thus be more excellent.

Other components overlap those described above, and thus, detailed descriptions thereof are omitted. In addition, processes of manufacturing the fan-out semiconductor package 100E according to another exemplary embodiment are substantially the same as those of manufacturing the fan-out semiconductor package 100A according to the exemplary embodiment described above except that the underbump metal layer 160 and the electrical connection structures 170 are formed on an opposite surface to a surface in which the underbump metal layer 160 and the electrical connection structures 170 are formed in the fan-out semiconductor package 100A according to the exemplary embodiment so that the semiconductor chip 120 is disposed in the face-down form, and a detailed description thereof is thus omitted.

Figure 24:
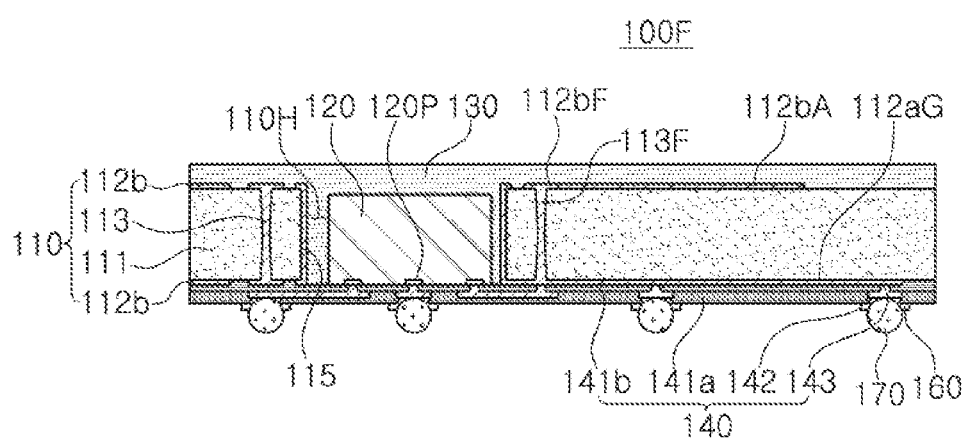
FIG. 24 is a schematic cross-sectional view illustrating another example of a fan-out semiconductor package.

FIG. 24 is a schematic cross-sectional view illustrating another example of a fan-out semiconductor package.

Referring to FIG. 24, a fan-out semiconductor package 100F according to another exemplary embodiment may be substantially the same as the fan-out semiconductor package 100E according to another exemplary embodiment described above except that it further includes a metal layer 115 disposed on walls of a through-hole 110H, The metal layer 115 may include a conductive material such as copper (Cu), aluminum (Al), silver (Ag), tin (Sn), gold (Au), nickel (Ni), lead (Pb), titanium (Ti), or alloys thereof. The metal layer 115 may be connected to a ground pattern 112*a*G of a first wiring layer 112*a* to be thus used as a ground. When a second wiring layer 112*b* has a ground pattern 112*b*G, the metal layer 115 may also be connected to the ground pattern 112*b*G. Since the metal layer 115 is formed on the walls of the through-hole 110 of a core member 110 using a single large area substrate, the metal layer 115 may seamlessly surround side portions of a semiconductor chip 120, and a heat dissipation effect or an electromagnetic wave blocking effect may thus be excellent.

Other components overlap those described above, and thus, detailed descriptions thereof are omitted. In addition, processes of manufacturing the fan-out semiconductor package 100F according to another exemplary embodiment are substantially the same as those of manufacturing the fan-out semiconductor package 100A according to the exemplary embodiment described above except that the metal layer 115 is formed on the walls of the through-hole 110H by plating and an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that the semiconductor chip 120 is disposed in face-down form, and a detailed description thereof is thus omitted.

Figure 25:
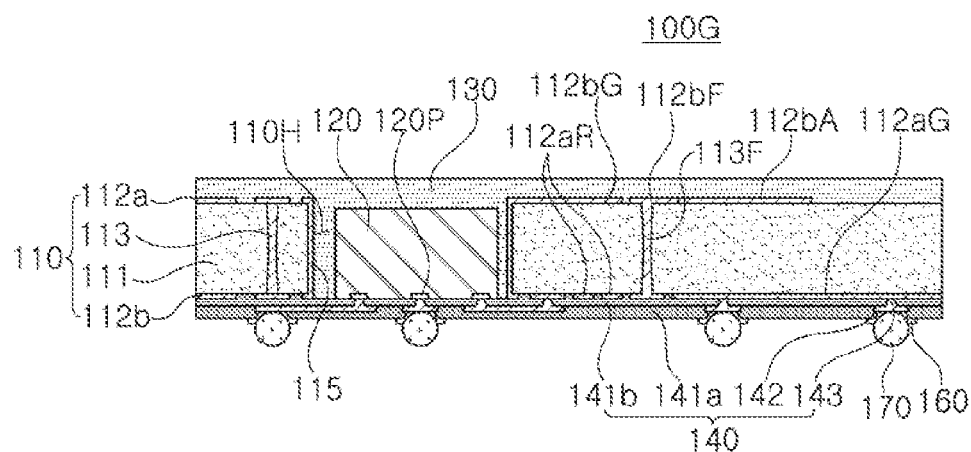
FIG. 25 is a schematic cross-sectional view illustrating another example of a fan-out semiconductor package.

FIG. 25 is a schematic cross-sectional view illustrating another example of a fan-out semiconductor package.

Referring to FIG. 25, a fan-out semiconductor package 100G according to another exemplary embodiment may be substantially the same as the fan-out semiconductor package 100E according to another exemplary embodiment described above except that a first wiring layer 112*a* of a core member 110 includes filter patterns 112*a*R. In addition, a metal layer 115 may be further disposed. The filter patterns 112*a*R may be a strip type, a microstrip type, or the like, but are not limited thereto. The filter pattern 112*a*R may have one end connected to a connection pad 120PS for a signal of connection pads 120P of a semiconductor chip 120 and the other end connected to a feeding line 112*b*F of an antenna pattern 112*b*A. The connection pad 120PS for a signal and the feeding line 112*b*F may be connected to each other through the filter pattern 112*a*R in a signal manner, resulting in removal of various noise. Likewise, a via 113 may include a feeding line 113F. The second wiring layer 112*b* may include a ground pattern 112*b*G for the filter pattern 112*a*R.

Other components overlap those described above, and thus, detailed descriptions thereof are omitted. In addition, processes of manufacturing the fan-out semiconductor package 100G according to another exemplary embodiment are substantially the same as those of manufacturing the fan-out semiconductor package 100A according to the exemplary embodiment described above except that the metal layer 115 is formed on walls of a through-hole 110H by plating, the filter patterns 112*a*R are formed when the first wiring layer 112*a* is formed, and an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that the semiconductor chip 120 is disposed in face-down form, and a detailed description thereof is thus omitted.

Figure 26:
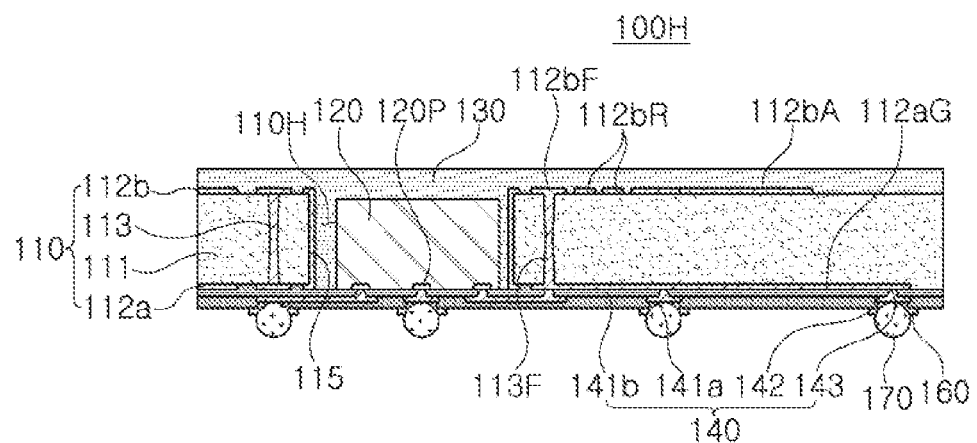
FIG. 26 is a schematic cross-sectional view illustrating another example of a fan-out semiconductor package.

FIG. 26 is a schematic cross-sectional view illustrating another example of a fan-out semiconductor package.

Referring to FIG. 26, a fan-out semiconductor package 100H according to another exemplary embodiment may be substantially the same as the fan-out semiconductor package 100E according to another exemplary embodiment described above except that a second wiring layer 112*b* of a core member 110 includes filter patterns 112*b*R. In addition, a metal layer 115 may be further disposed. The filter patterns 112*b*R may be a strip type, a microstrip type, or the like, but are not limited thereto. The filter pattern 112*b*R may have one end connected to a connection pad 120PS for a signal of connection pads 120P of a semiconductor chip 120 and the other end connected to a feeding line 112*b*F of an antenna pattern 112*b*A. The connection pad 120PS for a signal and the feeding line 112*b*F may be connected to each other through the filter pattern 112*b*R in a signal manner, resulting in removal of various noise. Likewise, a via 113 may include a feeding line 113F. Meanwhile, since the core member 110 is formed on the basis of a single large area substrate, the filter patterns 112*b*R and the feeding line 112*b*F may be coplanar with each other, and be thus connected to each other by only a pattern without using a separate via. A ground pattern 112*a*G may also provide a ground for the filter patterns 112*b*R.

Other components overlap those described above, and thus, detailed descriptions thereof are omitted. In addition, processes of manufacturing the fan-out semiconductor package 100H according to another exemplary embodiment are substantially the same as those of manufacturing the fan-out semiconductor package 100A according to the exemplary embodiment described above except that the metal layer 115 is formed on walls of a through-hole 110H by plating, the filter patterns 112*b*R are formed when the second wiring layer 112*b* is formed, and an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that the semiconductor chip 120 is disposed in face-down form, and a detailed description thereof is thus omitted.

Figure 27:
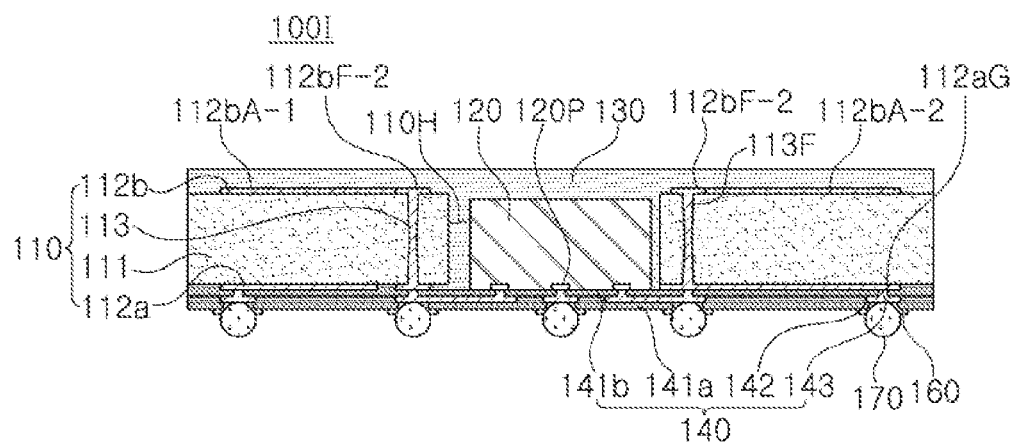
FIG. 27 is a schematic cross-sectional view illustrating another example of a fan-out semiconductor package.

FIG. 27 is a schematic cross-sectional view illustrating another example of a fan-out semiconductor package.

Referring to FIG. 27, a fan-out semiconductor package 100I according to another exemplary embodiment may be substantially the same as the fan-out semiconductor package 100E according to another exemplary embodiment described above except that an antenna pattern includes receive (Rx) antennas and transmit (Tx) antennas and the receive (Rx) antennas and the transmit (Tx) antennas are separated from each other. For example, as described above, a transmit antenna 112*b*A-1 may be disposed at the left in relation to a semiconductor chip 120, a receive antenna 112*b*A-2 may be disposed at the right in relation to the semiconductor chip 120, and the transmit antenna 112*b*A-1 and the receive antenna 112*b*A-2 may be connected to the semiconductor chip 120 through feeding lines 112*b*F1 and 112*b*F2, respectively, in a signal manner. In addition, the transmit antennas and the receive antennas may be disposed in the forms described in the fan-out semiconductor package 100D according to another exemplary embodiment described above. That is, the transmit (Tx) antennas and the receive (Rx) antennas may be disposed in various forms.

Other components overlap those described above, and thus, detailed descriptions thereof are omitted. In addition, processes of manufacturing the fan-out semiconductor package 100I according to another exemplary embodiment are substantially the same as those of manufacturing the fan-out semiconductor package 100A according to the exemplary embodiment described above except that the antenna patterns 112*b*A-1 and 112*b*A-2 are formed in various forms when the second wiring layer 112*b* is formed and an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that the semiconductor chip 120 is disposed in face-down form, and a detailed description thereof is thus omitted. Meanwhile, the metal layer 115 described in the fan-out semiconductor package 100F according to another exemplary embodiment or the filter patterns 112*a*R or 112*b*R described in the fan-out semiconductor package 100G or 100H according to another exemplary embodiment may also be applied to the fan-out semiconductor package 100I according to another exemplary embodiment.

Figure 28:
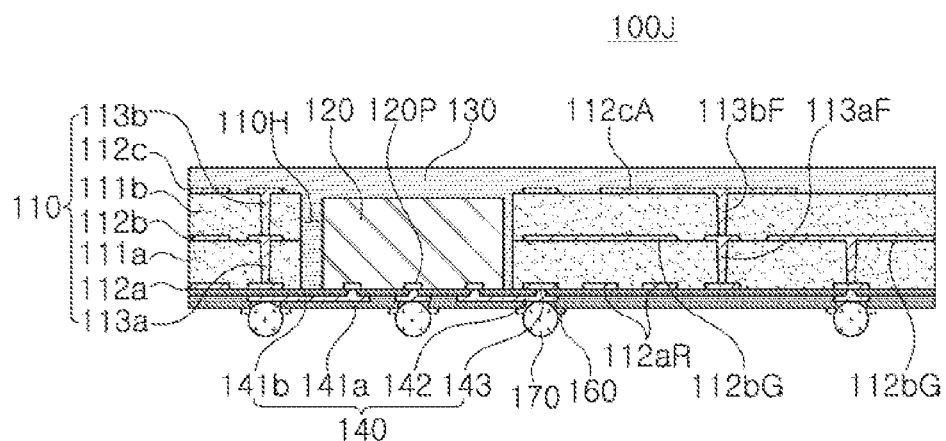
FIG. 28 is a schematic cross-sectional view illustrating another example of a fan-out semiconductor package.

FIG. 28 is a schematic cross-sectional view illustrating another example of a fan-out semiconductor package.

Referring to FIG. 28, a fan-out semiconductor package 100J according to another exemplary embodiment may be substantially the same as the fan-out semiconductor package 100E according to another exemplary embodiment described above except that a core member 110 includes a first insulating layer 111*a*, a first wiring layer 112*a* embedded in the first insulating layer 111*a* so that a lower surface thereof is exposed, a second wiring layer 112*b* disposed on the other surface of the first insulating layer 111*a* opposing one surface of the first insulating layer 111*a* on which the first wiring layer 112*a* is disposed, a second insulating layer 111*b* disposed on the first insulating layer 111*a* and covering the second wiring layer 112*b*, and a third wiring layer 112*c* disposed on the second insulating layer 111*b*. The first to third wiring layers 112*a*, 112*b*, and 112*c* may be electrically connected to each other through first and second vias 113*a* and 113*b* each penetrating through the first to third insulating layers 111*a* and 111*b*. A lower surface of the first wiring layer 112*a* may have a step with respect to a lower surface of the first insulating layer 111*a*. In this case, an insulating distance of a connection member 140 may become more constant, and a phenomenon in which an encapsulant 130 bleeds may be prevented to some degree. The first to third wiring layers 112*a*, 112*b*, and 112*c* may have thicknesses greater than that of a redistribution layer 142.

The first wiring layer 112*a* may include a filter pattern 112*a*R, the second wiring layer 112*b* may include a ground pattern 112*b*G, and the third wiring layer 112*c* may include an antenna pattern 112*c*A. The first and second vias 113*a* and 113*b* may provide feeding lines 113*a*F and 113*b*F, respectively. The ground pattern 112*b*G may be a ground for the antenna pattern 112*c*A and the filter pattern 112*a*R. As described above, when the core member 110 includes a larger number of wiring layers 112*a*, 112*b*, and 112*c*, the antenna pattern 112*c*A, the ground pattern 112*b*G, and the filter pattern 112*a*R may be disposed in various forms. Meanwhile, an appropriate combination of a material having high dielectric constant (Er1) characteristics for reducing a size of an antenna and a material having low dielectric constant (Er2) characteristics for reducing loss of a filter may be used as materials of the first and second insulating layers 111*a* and 111*b*.

Other components overlap those described above, and thus, detailed descriptions thereof are omitted. In addition, processes of manufacturing the fan-out semiconductor package 100J according to another exemplary embodiment are substantially the same as those of manufacturing the fan-out semiconductor package 100A according to the exemplary embodiment described above except that the core member 110 is manufactured by a coreless method, an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that a semiconductor chip 120 is disposed in face-down form, and a metal layer 115, the filter pattern 112*a*R, and the like, are further formed, and a detailed description thereof is thus omitted. The metal layer 115 described in the fan-out semiconductor package 100F according to another exemplary embodiment may also be applied to the fan-out semiconductor package 100J according to another exemplary embodiment.

Figure 29:
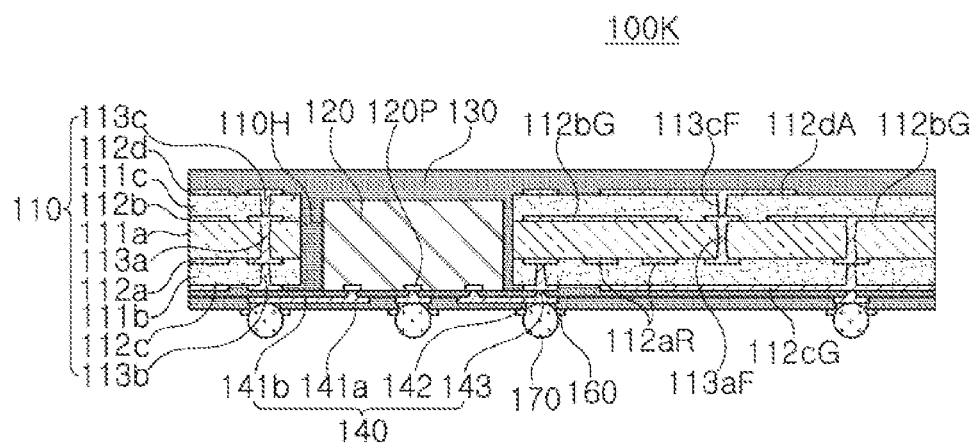
FIG. 29 is a schematic cross-sectional view illustrating another example of a fan-out semiconductor package.

FIG. 29 is a schematic cross-sectional view illustrating another example of a fan-out semiconductor package.

Referring to FIG. 29, a fan-out semiconductor package 100K according to another exemplary embodiments may be substantially the same as the fan-out semiconductor package 100E according to another exemplary embodiment described above except that a core member 110 may include a first insulating layer 111a, a first wiring layer 112a disposed beneath the first insulating layer 111a, a second wiring layer 112b disposed on the first insulating layer 111a, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to each other through first to third vias 113a, 113b, and 113c penetrating through the first to third insulating layers 111a, 111b, and 111c, respectively. The first insulating layer 111a may have a thickness greater than those of the second and third insulating layers 111b and 111c. The first insulating layer 111a may have an elastic modulus greater than those of the second and third insulating layers 111b and 111c. For example, the first insulating layer 111a may include prepreg, and the second and third insulating layers 111b and 111c may include ABF. However, the materials of the first insulating 111a and the second and third insulating layers 111b and 111c are not limited thereto. The first to fourth wiring layers 112a, 112b, 112c, and 112d may have thicknesses greater than that of a redistribution layer 142.

The first wiring layer 112a may include a filter pattern 112aR, the second wiring layer 112b may include a ground pattern 112bG, the third wiring layer 112c may include a ground pattern 112cG, and the fourth wiring layer 112d may include an antenna pattern 112dA. The first and third vias 113a and 113c may provide feeding lines 113aF and 113cF, respectively. The ground pattern 112bG may be a ground of the antenna pattern 112dA and the filter pattern 112aR. The ground pattern 112cG may be a ground of the filter pattern 112aR. As described above, when the core member 110 includes a larger number of wiring layers 112a, 112b, 112c, and 112d, the antenna pattern 112dA, the ground patterns 112bG and 112cG, and the filter pattern 112aR may be disposed in various forms. Meanwhile, an appropriate combination of a material having high dielectric constant (Er1) characteristics for reducing a size of an antenna and a material having low dielectric constant (Er2) characteristics for reducing loss of a filter may be used as materials of the first to third insulating layers 111a, 111b, and 111c.

Other components overlap those described above, and thus, detailed descriptions thereof are omitted. In addition, processes of manufacturing the fan-out semiconductor package 100K according to another exemplary embodiment are substantially the same as those of manufacturing the fan-out semiconductor package 100A according to the exemplary embodiment described above except that a larger number of wiring layers 112c and 112d are formed using ABF, or the like, as a build-up layer when the core member 110 is formed, an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that a semiconductor chip 120 is disposed in face-down form, and a metal layer 115, the filter pattern 112aR, and the like, are further formed, and a detailed description thereof is thus omitted. The metal layer 115 described in the fan-out semiconductor package 100F according to another exemplary embodiment may also be applied to the fan-out semiconductor package 100K according to another exemplary embodiment.

Figure 30:
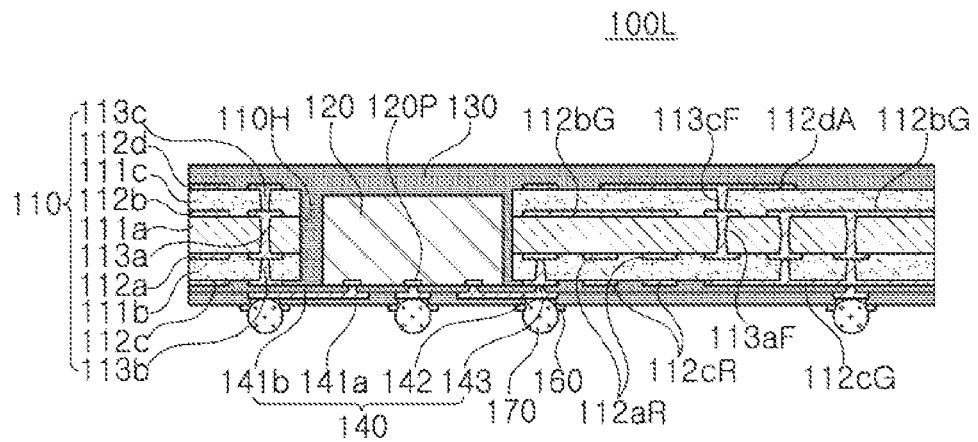
FIG. 30 is a schematic cross-sectional view illustrating another example of a fan-out semiconductor package.

FIG. 30 is a schematic cross-sectional view illustrating another example of a fan-out semiconductor package.

Referring to FIG. 30, in a fan-out semiconductor package 100L according to another exemplary embodiment, a core member 110 may include first to third insulating layers 111a, 111b, and 111c, first to fourth wiring layers 112a, 112b, 112c, and 112d, and first to third vias 113a, 113b, and 113c, as in the fan-out semiconductor package 100K according to another exemplary embodiment described above. In this case, filter patterns 112aR and 112cR may be formed on different wiring layers 112a and 112c. That is, the filter patterns 112aR and 112cR may be disposed on different levels and be connected to each other in an interlayer coupling manner.

Other components overlap those described above, and thus, detailed descriptions thereof are omitted. In addition, processes of manufacturing the fan-out semiconductor package 100L according to another exemplary embodiment are substantially the same as those of manufacturing the fan-out semiconductor package 100A according to the exemplary embodiment described above except that a larger number of wiring layers 112c and 112d are formed using ABF, or the like, as a build-up layer when the core member 110 is formed, an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that a semiconductor chip 120 is disposed in face-down form, and a metal layer 115, the filter patterns 112aR and 112cR, and the like, are further formed, and a detailed description thereof is thus omitted. The metal layer 115 described in the fan-out semiconductor package 100F according to another exemplary embodiment may also be applied to the fan-out semiconductor package 100L according to another exemplary embodiment.

Figure 31:
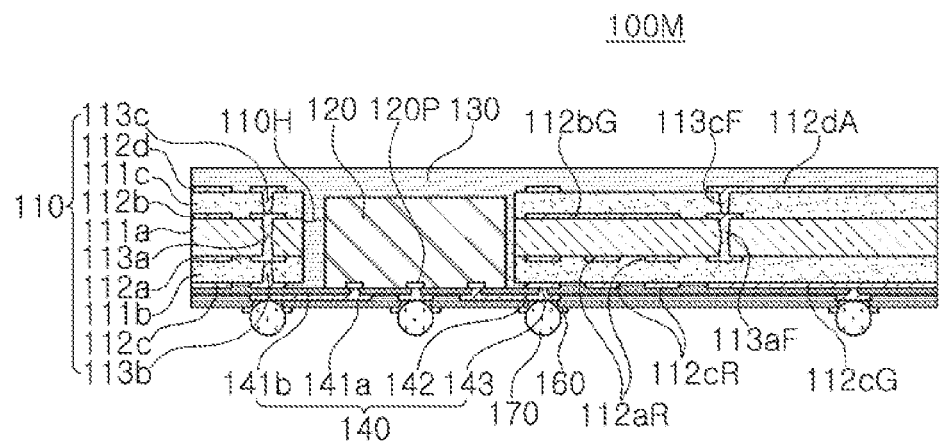
FIG. 31 is a schematic cross-sectional view illustrating another example of a fan-out semiconductor package.

FIG. 31 is a schematic cross-sectional view illustrating another example of a fan-out semiconductor package.

Referring to FIG. 31, in a fan-out semiconductor package 100M according to another exemplary embodiment, a core member 110 may include first to third insulating layers 111a, 111b, and 111c, first to fourth wiring layers 112a, 112b, 112c, and 112d, and first to third vias 113a, 113b, and 113c, as in the fan-out semiconductor package 100L according to another exemplary embodiment described above. In this case, filter patterns 112aR and 112cR may be formed on different wiring layers 112a and 112c. That is, the filter patterns 112aR and 112cR may be disposed on different levels and be connected to each other in an interlayer coupling manner. However, only dielectrics of the insulating layers 111a, 111b, and 111c may be disposed and the first wiring layer 112a and the second wiring layer 112b may not be disposed, between a ground pattern 112cG of the third wiring layer 112c and an antenna pattern 112dA of the fourth wiring layer 112d so that the ground pattern 112cG may be used as a ground of the antenna pattern 112dA. In this case, a distance between the ground pattern 112cG and the antenna pattern 112dA filled with the dielectrics may be increased to implement more excellent antenna characteristics.

Other components overlap those described above, and thus, detailed descriptions thereof are omitted. In addition, processes of manufacturing the fan-out semiconductor package 100M according to another exemplary embodiment are substantially the same as those of manufacturing the fan-out semiconductor package 100A according to the exemplary embodiment described above except that a larger number of wiring layers 112c and 112d are formed using ABF, or the like, as a build-up layer when the core member 110 is formed, an underbump metal layer 160 and electrical connection structures 170 are formed on an opposite surface to a surface in which the underbump metal layer 160 and the electrical connection structures 170 are formed in the fan-out semiconductor package 100A according to the exemplary embodiment so that a semiconductor chip 120 is disposed in face-down form, and a metal layer 115, the filter patterns 112aR and 112cR, and the like, are further formed, and a detailed description thereof is thus omitted. The metal layer 115 described in the fan-out semiconductor package 100F according to another exemplary embodiment may also be applied to the fan-out semiconductor package 100M according to another exemplary embodiment.

As set forth above, according to the exemplary embodiments in the present disclosure, a fan-out semiconductor package in which loss of a signal transfer may be prevented by significantly reducing a distance between a semiconductor chip and an antenna pattern, stable antenna performance may be secured in a single package, an overall size of a package may be reduced, and a process may be simplified may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a core member having a through-hole;
   a semiconductor chip disposed in the through-hole and having an active surface having connection pads disposed thereon and an inactive surface opposing the active surface;
   an encapsulant encapsulating at least portions of the core member and the semiconductor chip; and
   a connection member disposed on the core member and the active surface of the semiconductor chip and including a redistribution layer connected to the connection pads,
   wherein the core member includes a plurality of wiring layers disposed on different levels,
   a dielectric is disposed between the plurality of wiring layers of the core member,
   one of the plurality of wiring layers includes an antenna pattern and a ground pattern surrounding the antenna pattern,
   another of the plurality of wiring layers includes another ground pattern overlapping the antenna pattern in a stacking direction along which the plurality of wiring layers are stacked on each other, and
   the antenna pattern is connected to the connection pads through the redistribution layer.

2. A fan-out semiconductor package comprising:
   a core member a plurality of dielectric layers and a plurality of wiring layers alternately disposed, and having a through-hole penetrating through the plurality of insulating layers;
   a semiconductor chip disposed in the through-hole and having an active surface having connection pads disposed thereon and an inactive surface opposing the active surface;
   an encapsulant encapsulating at least portions of the core member and the semiconductor chip; and
   a connection member disposed on the core member and the active surface of the semiconductor chip and including a redistribution layer connected to the connection pads,
   wherein an outermost one of the plurality of wiring layers includes an antenna pattern,
   another one of the plurality of wiring layers, disposed between two of the plurality of dielectric layers, includes a ground pattern overlapping the antenna pattern in a stacking direction along which the plurality of wiring layers are stacked on each other, and
   the antenna pattern is connected to the connection pads through the redistribution layer.

* * * * *